(12) United States Patent
Kim et al.

(10) Patent No.: US 12,075,647 B2
(45) Date of Patent: Aug. 27, 2024

(54) DISPLAY DEVICE INCLUDING DAM AND GROOVE STRUCTURE IN NON-DISPLAY AREA

(71) Applicant: Samsung Display Co., LTD., Yongin-si (KR)

(72) Inventors: Daehong Kim, Seongnam-si (KR); Jeongmoon Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 134 days.

(21) Appl. No.: 17/467,611

(22) Filed: Sep. 7, 2021

(65) Prior Publication Data

US 2022/0181583 A1 Jun. 9, 2022

(30) Foreign Application Priority Data

Dec. 9, 2020 (KR) .......................... 10-2020-0171604

(51) Int. Cl.
*H10K 50/84* (2023.01)
*G06T 7/13* (2017.01)
*H10K 50/844* (2023.01)
*H10K 59/12* (2023.01)

(52) U.S. Cl.
CPC ............ *H10K 50/844* (2023.02); *G06T 7/13* (2017.01); *H10K 59/12* (2023.02); *H05K 2201/09909* (2013.01)

(58) Field of Classification Search
CPC .. H10K 50/844; H10K 50/84; H10K 50/8428; H10K 50/8445; H10K 50/8426; H10K 59/12; H10K 59/122; H10K 59/124; H10K 59/121; H10K 59/126; H10K 77/10; H10K 21/76232; G06T 7/13; H05K 2201/09909

See application file for complete search history.

(56) References Cited

U.S. PATENT DOCUMENTS

| | | | |
|---|---|---|---|
| 10,541,380 B1* | 1/2020 | Sung | H10K 59/124 |
| 2018/0061910 A1* | 3/2018 | Cai | H10K 59/131 |
| 2018/0190170 A1 | 7/2018 | Yang | |
| 2019/0081129 A1* | 3/2019 | Sung | H10K 59/873 |
| 2019/0137812 A1* | 5/2019 | Han | G02F 1/136209 |
| 2019/0334120 A1* | 10/2019 | Seo | G06F 3/0444 |
| 2020/0006701 A1 | 1/2020 | Lee et al. | |
| 2020/0106046 A1* | 4/2020 | Kim | H10K 50/844 |
| 2020/0110495 A1* | 4/2020 | Han | G06F 3/0446 |
| 2020/0127233 A1* | 4/2020 | Sung | H10K 77/111 |
| 2020/0144341 A1* | 5/2020 | Choi | H10K 59/124 |

(Continued)

FOREIGN PATENT DOCUMENTS

| | | | | |
|---|---|---|---|---|
| CN | 104362167 A | * | 2/2015 | ............. H10K 59/12 |
| KR | 1020180047295 A | | 5/2018 | |

(Continued)

*Primary Examiner* — Ida M Soward
(74) *Attorney, Agent, or Firm* — CANTOR COLBURN LLP

(57) ABSTRACT

A display device includes a display area including a light emitting element and an organic insulating layer on the light emitting element; and a non-display area adjacent to the display area in a first direction, the non-display area including a first dam spaced apart from the organic insulating layer in the first direction, and a first groove between the organic insulating layer and the first dam in the first direction.

21 Claims, 18 Drawing Sheets

(56) References Cited

U.S. PATENT DOCUMENTS

| | | | |
|---|---|---|---|
| 2020/0144535 A1* | 5/2020 | Kim | H10K 59/65 |
| 2020/0161582 A1 | 5/2020 | Choi et al. | |
| 2020/0174295 A1* | 6/2020 | Baek | G02F 1/1339 |
| 2020/0175901 A1* | 6/2020 | Lee | G09G 3/006 |
| 2020/0176529 A1* | 6/2020 | Choi | H10K 59/131 |
| 2020/0235180 A1 | 7/2020 | Park et al. | |
| 2020/0313101 A1* | 10/2020 | Jung | H10K 59/12 |
| 2020/0321561 A1* | 10/2020 | Park | H10K 59/65 |
| 2020/0328376 A1* | 10/2020 | Seo | H10K 59/122 |
| 2022/0037442 A1* | 2/2022 | Liu | H10K 50/856 |
| 2022/0393137 A1* | 12/2022 | Choi | H10K 59/80 |

FOREIGN PATENT DOCUMENTS

| | | | | |
|---|---|---|---|---|
| KR | 1020180052158 A | | 5/2018 | |
| KR | 20180077898 A | | 7/2018 | |
| KR | 1020190004407 A | | 1/2019 | |
| KR | 20200003336 A | | 1/2020 | |
| KR | 20200060594 A | | 6/2020 | |
| KR | 20200075493 A | * | 6/2020 | H10K 59/124 |
| KR | 20200090595 A | | 7/2020 | |
| WO | WO-2020054915 A1 | * | 3/2020 | F03D 7/0272 |
| WO | WO-2020166793 A1 | * | 8/2020 | G06T 5/007 |

\* cited by examiner

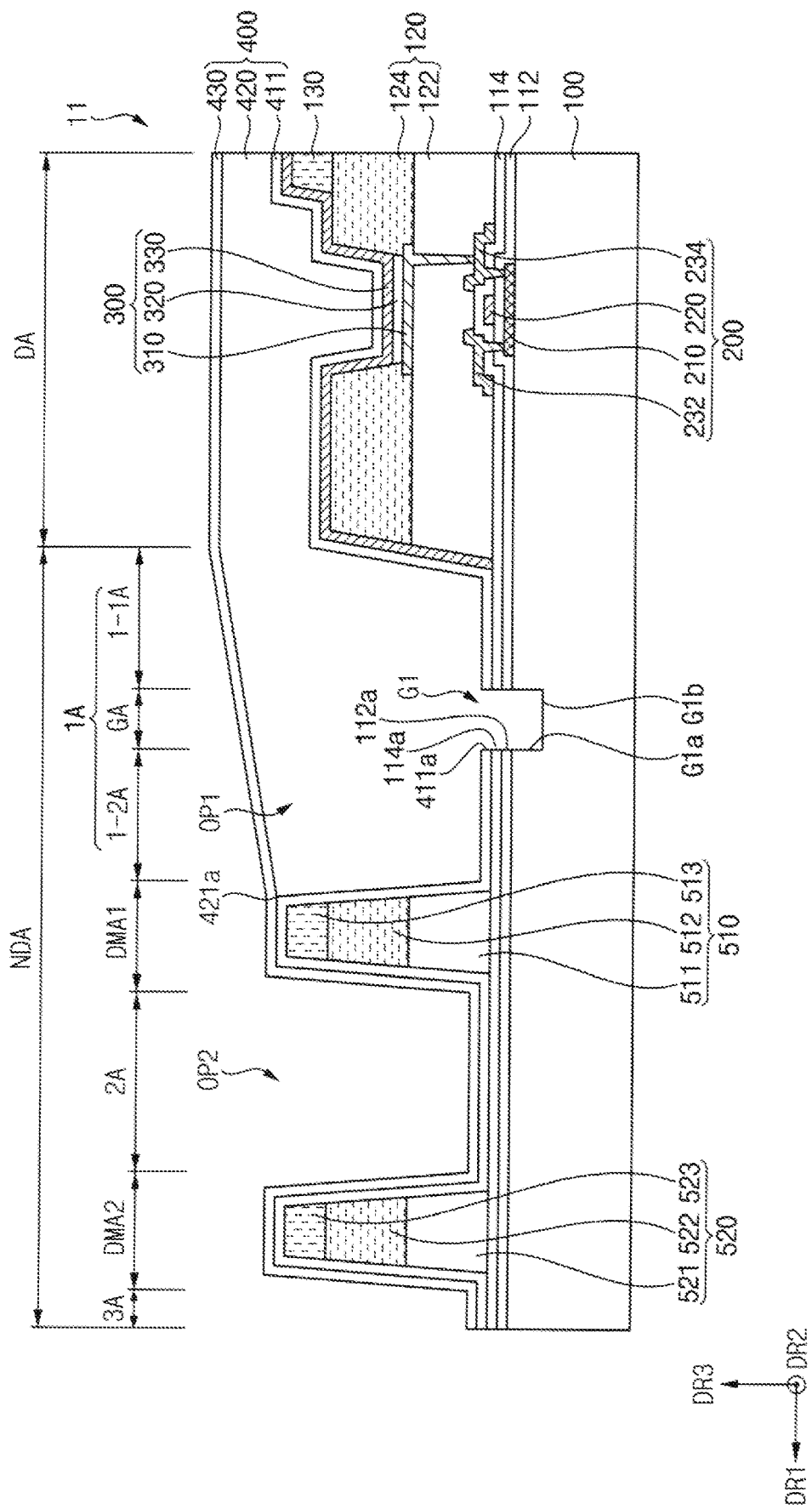

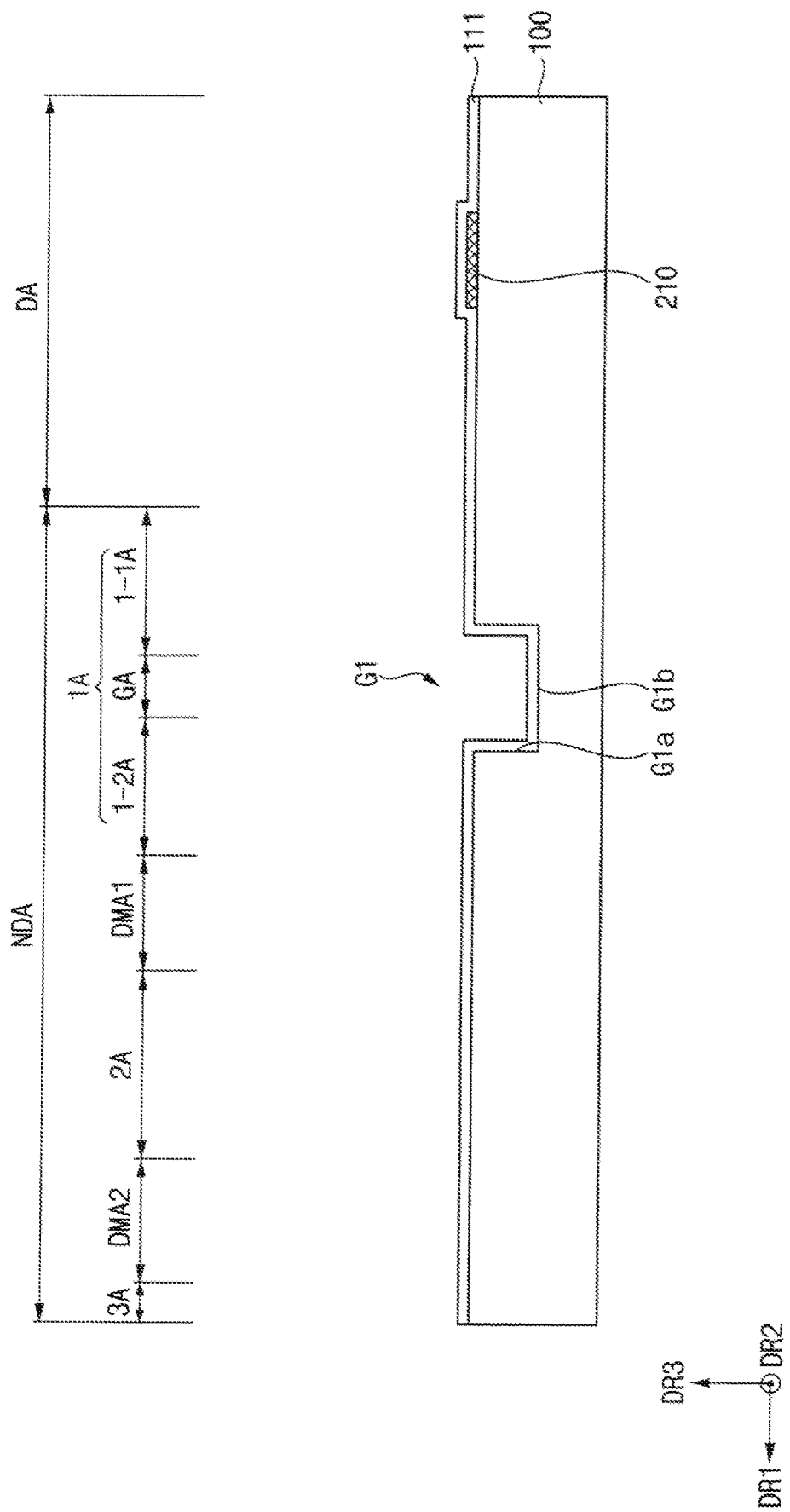

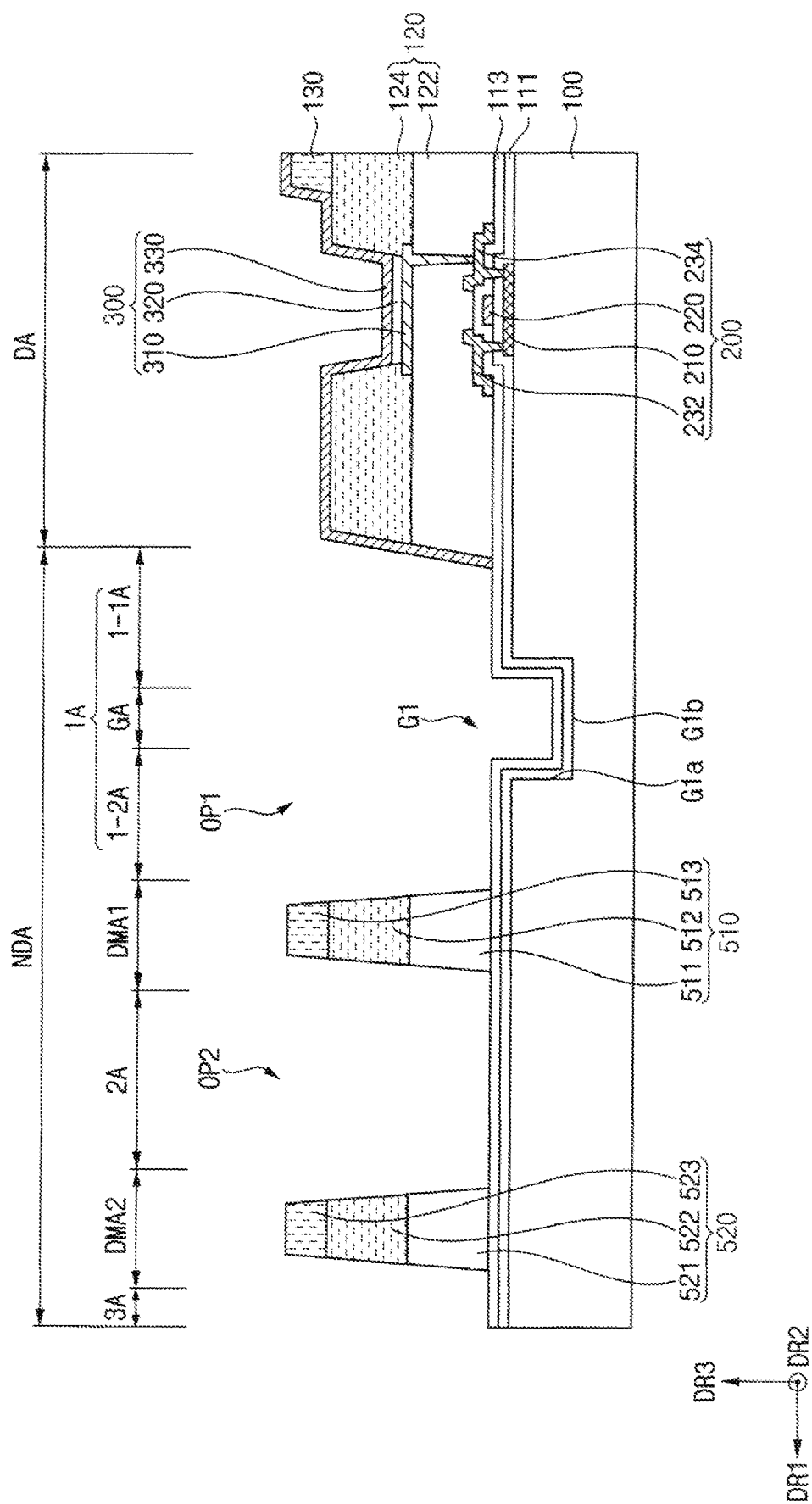

DISPLAY DEVICE INCLUDING DAM AND GROOVE STRUCTURE IN NON-DISPLAY AREA

This application claims priority to Korean Patent Application No. 10-2020-0171604, filed on Dec. 9, 2020, and all the benefits accruing therefrom under 35 U.S.C. § 119, which is hereby incorporated by reference for all purposes as if fully set forth herein.

BACKGROUND

1. Field

Embodiments relate to a display device and method of providing or manufacturing the same.

2. Description of the Related Art

Flat panel display devices are replacing cathode ray tube display devices as display devices due to lightweight and thin characteristics of the flat panel display devices. As representative examples of such flat panel display devices, there are liquid crystal display devices and organic light emitting diode display devices.

The display device may include a display area and a non-display area. A light emitting element that generates a light may be in the display area. The display device may include an encapsulation layer that encapsulates the display area to protect the light emitting element. The encapsulation layer may include at least one inorganic encapsulation layer and at least one organic encapsulation layer.

SUMMARY

Embodiments provide a display device with improved reliability.

Embodiments also provide a method of providing or manufacturing a display device with improved reliability.

Additional features of the invention will be set forth in the description which follows, and in part will be apparent from the description, or may be learned by practice of the embodiments.

A display device includes a display area and a non-display area adjacent to the display area in a first direction. The display area may include an organic insulating layer and a light emitting element on the organic insulating layer. The non-display area may include a first dam spaced apart from the organic insulating layer in the first direction and a first groove between the organic insulating layer and the first dam in the first direction.

In an embodiment, along the first direction, the first groove may be spaced apart from each of the organic insulating layer and the first dam.

In an embodiment, the first dam which is spaced apart from the organic insulating layer in the first direction defines a first opening therebetween. The first groove may correspond to the first opening which is between the organic insulating layer and the first dam.

In an embodiment, the first opening which is between the organic insulating layer and the first dam may extend in a second direction crossing the first direction.

In an embodiment, the first groove may include a plurality of groove patterns spaced apart from each other.

In an embodiment, the groove patterns may be arranged along the second direction.

In an embodiment, the first groove may have a stripe shape.

In an embodiment, stripe shape of the first groove may extend along the second direction.

In an embodiment, the non-display area may further include a second dam spaced apart from the first dam in the first direction.

In an embodiment, the non-display area may further include a second groove between the first dam and the second dam in the first direction.

In an embodiment, along the first direction, the second groove may be spaced apart from each of the first dam and the second dam.

In an embodiment, the second dam which is spaced apart from the first dam may define a second opening therebetween. The second groove may correspond to the second opening which is between the first dam and the second dam.

In an embodiment, the display device may further include a substrate and an inorganic insulating layer in the display area and in the non-display area. The substrate, the inorganic insulating layer, the organic insulating layer and the light emitting element may be in order in the display area.

In an embodiment, the substrate may include a side surface and a bottom surface in the non-display area which define the first groove in the non-display area. The inorganic insulating layer may extend from the display area to cover the side surface and the bottom surface of the substrate at the first groove.

In an embodiment, the substrate may include a side surface and a bottom surface in the non-display area. The inorganic insulating layer may include a side surface in the non-display area which defines a hole in the inorganic insulating layer. The hole in the inorganic insulating layer may expose the substrate to outside the inorganic insulating layer. The side surface of the substrate, the bottom surface of the substrate and the side surface of the inorganic insulating layer may together define the first groove.

In an embodiment, the inorganic insulating layer may include a side surface in the non-display area which defines the first groove in the non-display area. The first groove defined by the inorganic insulating layer may expose the substrate to outside the inorganic insulating layer at the first groove.

In an embodiment, the display device may further include a substrate, a first inorganic encapsulation layer, an organic encapsulation layer and a second inorganic encapsulation layer in both the display area and the non-display area. The substrate, the light emitting element, the first inorganic encapsulation layer, the organic encapsulation layer and the second inorganic encapsulation layer may be in order in the display area. The organic encapsulation layer may include an outer edge which is furthest from the display area in the first direction. The outer edge of the organic encapsulation layer may be between the display area and the first dam.

In an embodiment, in the non-display area, each of the first and second inorganic encapsulation layers may extend further than the first dam in the first direction.

In an embodiment, the substrate may include a side surface and a bottom surface in the non-display area which define the first groove in the non-display area. The first inorganic encapsulation layer may extend from the display area to cover the side surface and the bottom surface of the substrate at the first groove.

In an embodiment, the substrate may include a side surface and a bottom surface in the non-display area. The first inorganic encapsulation layer may include a side surface in the non-display area which is aligned with the side surface of the substrate. The side surface of the substrate, the bottom surface of the substrate and the side surface of the first inorganic encapsulation layer may together define the first groove.

In an embodiment, the first inorganic encapsulation layer may include a side surface in the non-display area. The substrate may be exposed to outside the first inorganic encapsulation layer at the first groove. The side surface of the first inorganic encapsulation layer and the substrate together may define the first groove.

A method of providing a display device includes providing a substrate including a display area and a non-display area which is adjacent to the display area in a first direction, providing a groove in the non-display area which is open in a direction away from the substrate and includes an edge, providing an organic insulating layer and a light emitting element in the display area, in order from the substrate, providing a first inorganic encapsulation layer on the organic insulating layer to cover the light emitting element, providing an organic encapsulation layer on the first inorganic encapsulation layer to cover the display area, the organic encapsulation layer including an outer edge which is furthest from the display area in the first direction, providing a determination of a location of the outer edge of the organic encapsulation layer within the non-display area by using the edge of the groove, and providing a second inorganic encapsulation layer on the organic encapsulation layer.

In an embodiment, along the first direction, the organic insulating layer may be spaced apart from the groove.

In an embodiment, the method may further include providing a dam in the non-display area of the substrate, the dam being spaced apart from the groove and further from the display area than the groove. The dam and the organic insulating layer may be provided simultaneously.

In an embodiment, the providing of the determination of the location of the outer edge of the organic encapsulation layer may include providing an image of the non-display area which includes the edge of the groove.

In an embodiment, the providing of the image of the non-display area which includes the edge of the groove may include providing a sharpness calculation of the edge of the groove within the image. The sharpness calculation may indicate the location of the outer edge of the organic encapsulation layer relative to the edge of the groove along the first direction.

In an embodiment, the first inorganic encapsulation layer may be provided in an entirety of in the display area and an entirety of the non-display area of the substrate.

In an embodiment, the providing of the groove may include providing the substrate including a side surface and a bottom surface in the non-display area which define the groove in the non-display area. The first inorganic encapsulation layer may extend from the display area and into the groove to cover the side surface and the bottom surface of the substrate at the groove.

In an embodiment, the providing of the groove in the non-display area may be between the providing of the first inorganic encapsulation layer and the providing of the organic encapsulation layer.

In an embodiment, the providing of the groove in the non-display area may include providing the substrate including a side surface and a bottom surface in the non-display area, providing a hole in the first inorganic encapsulation layer which is defined by a side surface of the first inorganic encapsulation layer and exposes the side surface and the bottom surface of the substrate to outside the first inorganic encapsulation layer, and providing the side surface of the first inorganic encapsulation layer at the hole and the side surface of the substrate aligned with the side surface of the first inorganic encapsulation layer to define the groove in the non-display area.

In an embodiment, the providing of the groove in the non-display area may include providing a hole in the first inorganic encapsulation layer which exposes the substrate to outside the first inorganic encapsulation layer and defines the groove in the non-display area together with the substrate.

One or more embodiment of the display device may include the substrate having the display area and the non-display area, and the dam provided in the non-display area on the substrate. The substrate may have the groove provided between the display area and the dam. An ejected position of the organic material for providing the organic encapsulation layer may be accurately determined based on the sharpness of the edge of the groove within an image of the groove. Accordingly, the reliability of the display device can be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

FIGS. 4A and 4B are cross-sectional views illustrating an embodiment of a display device.

FIGS. 5A to 5G are cross-sectional views illustrating an embodiment of a method of providing a display device.

DETAILED DESCRIPTION

Figure 1:
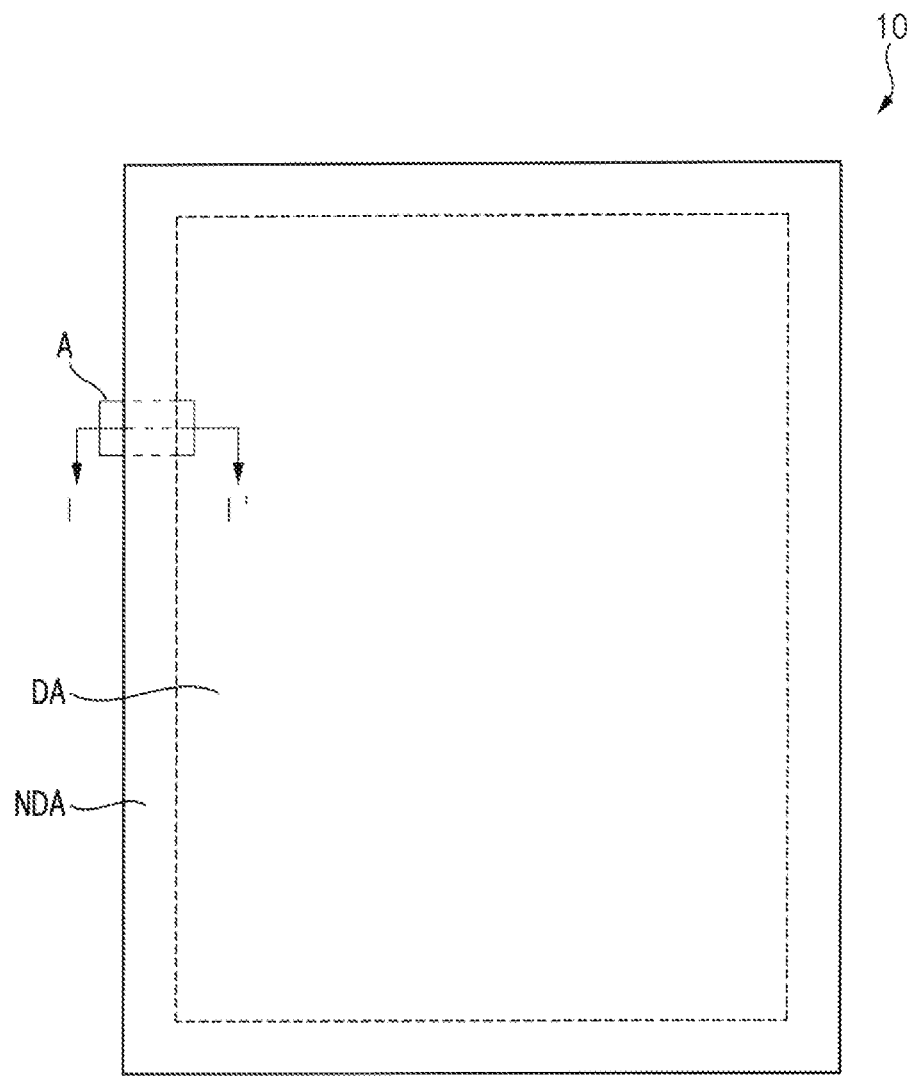
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

In providing a display device 10, an organic material encapsulation layer may be provided or formed using an organic material such as a monomer. When the organic material encapsulation layer is provided or formed, an overflow of the organic material to an edge of the display area DA of the display device 10 may create a defect in the display device 10.

FIG. 1 is a plan view illustrating an embodiment of a display device 10.

Referring to FIG. 1, a display device 10 may include (e.g., have) a display area DA and a non-display area NDA. An image may be displayed, a light may be generated or displayed, etc. in the display area DA. In an embodiment, for example, the non-display area NDA may be adjacent to the display area DA, such as being positioned outside the display area DA. In an embodiment, for example, the non-display area NDA may be around (e.g., surround) the display area DA in a plan view. Various elements and layers of the display device 10 may include a display area DA and a non-display area NDA corresponding to those described above for the display device 10.

A plurality of pixels may be disposed in the display area DA. In an embodiment, for example, the pixels may be arranged in a matrix form along a first direction DR1 and along a second direction DR2 which crosses the first direction DR1. In an embodiment, for example, the second direction DR2 may be perpendicular to the first direction DR1. Each of the pixels may include a transistor 200 and a light emitting element 300 which is connected to the transistor 200. The light emitting element 300 may generate and/or emit a light. In an embodiment, for example, the light emitting element 300 may include an organic light emitting diode. In an embodiment, for example, the light emitting element 300 may include a nano light emitting diode.

Figure 2:
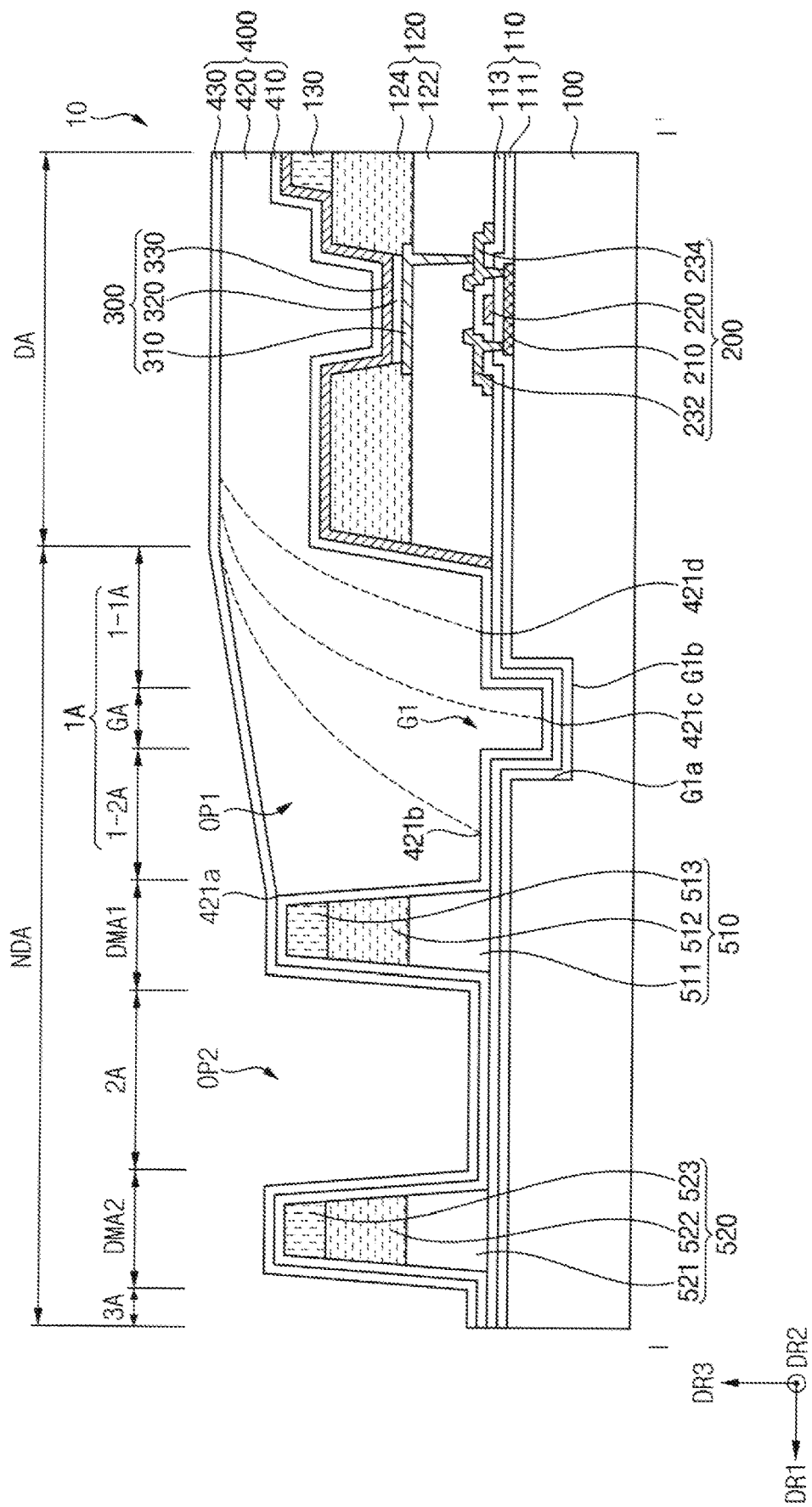
FIG. 2 is a cross-sectional view taken along line I-I' of FIG. 1.

FIG. 2 is a cross-sectional view taken along line I-I' of FIG. 1.

Referring to FIGS. 1 and 2, in an embodiment, the display device 10 may include a substrate 100, a transistor 200, a gate insulating layer 111, an interlayer insulating layer 113, a first organic insulating layer 122, a second organic insulating layer 124, a light emitting element 300, an encapsulation layer 400, a first dam 510, and a second dam 520. In an embodiment, for example, the transistor 200 may include an active layer 210, a gate electrode 220, a source electrode 232, and a drain electrode 234. In an embodiment, for example, the light emitting element 300 may include a pixel electrode 310, an emission layer 320, and a common electrode 330. In an embodiment, for example, the encapsulation layer 400 may include a first inorganic encapsulation layer 410, an organic encapsulation layer 420, and a second inorganic encapsulation layer 430.

The substrate 100 may be a transparent insulating substrate. In an embodiment, for example, the substrate 100 may be a flexible substrate including plastic or the like. In detail, the substrate 100 may be a polyimide substrate. The polyimide substrate may include a first polyimide layer, a barrier film layer, and a second polyimide layer. In an embodiment, the substrate 100 may include a quartz substrate, a synthetic quartz substrate, a calcium fluoride substrate, a fluorine-doped quartz substrate, a soda lime glass substrate, a non-alkali glass substrate, or the like.

The substrate 100 may include the display area DA and the non-display area NDA. In an embodiment, the non-display area NDA may include a first area 1A, a first dam area DMA1, a second area 2A, a second dam area DMA2, and a third area 3A in order in a direction away from the display area DA. The first dam area DMA1 may be positioned outside the display area DA and may be spaced apart from the display area DA. The second dam area DMA2 may be positioned outside the first dam area DMA1 and may be spaced apart from the first dam area DMA1. That is, the second dam area DMA2 may be further from the display area than the first dam area DMA1. The first area 1A may be positioned between the display area DA and the first dam area DMA1. That is the first area 1A may be closer to the display area DA than the first dam area DMA1. The second area 2A may be positioned between the first dam area DMA1 and the second dam area DMA2. The third area 3A may be positioned outside the second dam area DMA2. The third area 3A may correspond to an edge portion of the substrate 100 and be furthest from the display area DA than each of the first area 1A, the first dam area DMA1, the second area 2A and the second dam area DMA2.

In FIG. 2, outside of the display area DA may be an area positioned along the first direction DR1 of the display area DA. That is, the first dam area DMA1 may be spaced apart from the display area DA along the first direction DR1, and the second dam area DMA2 may be spaced apart from the first dam area DMA1 along the first direction DR1.

In an embodiment, for example, the first area 1A may include a groove area GA, a first-first area 1-1A (e.g., first sub-area), and a first-second area 1-2A (e.g., second sub-area). The groove area GA may be positioned between the display area DA and the first dam area DMA1. The groove area GA may be spaced apart from each of the display area DA and the first dam area DMA1. The first-first area 1-1A may be positioned between the display area DA and the groove area GA. The first-second area 1-2A may be positioned between the groove area GA and the first dam area DMA1.

In an embodiment, the substrate 100 may have or define a first groove G1. The first groove G1 may be provide or formed in the groove area GA of the substrate 100. The first groove G1 may be spaced apart from each of the display area DA and the first dam area DMA1.

The substrate 100 includes sidewalls which define sides of the first groove G1 and a surface which defines a bottom of the first groove G1. As illustrated in FIG. 2, a side surface G1a of the substrate 100 at the first groove G1 may have a relatively large inclination angle (e.g., about 90°) with respect to a bottom surface G1b of the substrate 100 the first groove G1. In an embodiment, for example, the side surface G1a of the substrate 100 at the first groove G1 may have a relatively small inclination angle with respect to the bottom surface G1b of the substrate 100 the first groove G1, and may have an inclined cross-sectional shape. In an embodiment, for example, the inclination angle may be variously adjusted according to a process of providing or forming the first groove G1 in the substrate 100 (e.g., a laser drilling process).

In embodiments, the substrate 100 may be a polyimide substrate. The polyimide substrate may include a first polyimide layer, a barrier film layer disposed on the first polyimide layer, and a second polyimide layer disposed on the barrier film layer. In an embodiment, for example, the first groove G1 may be formed on the second polyimide layer.

The active layer 210 may be disposed in the display area DA on the substrate 100. In an embodiment, for example, the active layer 210 may include a silicon semiconductor, an oxide semiconductor, or the like. The silicon semiconductor may include an amorphous silicon, a polycrystalline silicon, or the like. The active layer 210 may include a source area, a drain area, and a channel area. Impurities may be doped in the source area and the drain area. The channel area may be disposed between the source area and the drain area.

In an embodiment, although not illustrated in the drawing, a buffer layer may be disposed between the substrate 100 and the active layer 210. That is, the active layer 210 may be disposed in the display area DA on the buffer layer. The buffer layer may prevent or reduce penetration of foreign substances from the substrate 100 to the active layer 210. In an embodiment, for example, the buffer layer may include an inorganic insulating material such as silicon oxide ($SiO_x$), silicon nitride ($SiN_x$), titanium oxide ($TiO_x$), tantalum oxide ($TaO_x$), and/or the like.

The gate insulating layer 111 may be disposed on the substrate 100. In an embodiment, for example, the gate insulating layer 111 may be disposed in an entirety of the display area DA and an entirety of the non-display area NDA on the substrate 100. A portion of the gate insulating layer 111 which is disposed in the display area DA may cover the active layer 210 on the substrate 100. In an embodiment, for example, the gate insulating layer 111 may include an inorganic insulating material.

The gate electrode 220 may be disposed in the display area DA on the gate insulating layer 111. The gate electrode 220 may overlap the channel area of the active layer 210. The gate electrode 220 may include a metal, an alloy, a conductive metal oxide, a conductive metal nitride, a transparent conductive material, and/or the like. In an embodiment, for example, the gate electrode 220 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and/or the like.

The interlayer insulating layer 113 may be disposed on the gate insulating layer 111. In an embodiment, for example, the interlayer insulating layer 113 may be disposed in an entirety of the display area DA and an entirety of the non-display area NDA on the gate insulating layer 111. A portion of the interlayer insulating layer 113 which is disposed in the display area DA may cover the gate electrode 220 on the gate insulating layer 111. In an embodiment, for example, the interlayer insulating layer 113 may include an inorganic insulating material.

Hereinafter, the buffer layer, the gate insulating layer 111, and the interlayer insulating layer 113 may together be referred to as an inorganic insulating layer 110. The inorganic insulating layer 110 may be disposed in an entirety of the display area DA and an entirety of the non-display area NDA between the substrate 100 and the first organic insulating layer 122.

In an embodiment, as illustrated in FIG. 2, the inorganic insulating layer 110 may cover the side surface G1a and the bottom surface G1b of the first groove G1. The inorganic insulating layer 110 may extend from a top surface of the substrate 100, along the side surface G1a and along the bottom surface G1b at the first groove G1. In a method providing the display device 10, for example, after the first groove G1 is provided or formed in the substrate 100, the inorganic insulating layer 110 may be provided or formed on an entirety of the substrate 100. This will be described in more detail later with reference to FIGS. 5A to 5G.

The source electrode 232 and the drain electrode 234 may be disposed in the display area DA on the interlayer insulating layer 113. The source electrode 232 and the drain electrode 234 may be electrically connected to the source area and the drain area of the active layer 210, respectively. The source electrode 232 and the drain electrode 234 may include a metal, an alloy, a conductive metal oxide, a conductive metal nitride, a transparent conductive material, and/or the like. The active layer 210, the gate electrode 220, the source electrode 232, and the drain electrode 234 may together form the transistor 200. That is, the transistor 200 may be disposed in the display area DA on the substrate 100.

The first organic insulating layer 122 may be disposed in the display area DA on the interlayer insulating layer 113, and may cover the transistor 200. In an embodiment, for example, the first organic insulating layer 122 may be a planarization layer. The first organic insulating layer 122 may cover the source electrode 232 and the drain electrode 234 on the interlayer insulating layer 113. The first organic insulating layer 122 may have a substantially flat upper surface without a step around the source electrode 232 and the drain electrode 234. The first organic insulating layer 122 may include an organic insulating material such as a photoresist, a polyacryl-based resin, a polyimide-based resin, a polyamide-based resin, a siloxane-based resin, an acrylic-based resin, an epoxy-based resin, and/or the like.

The pixel electrode 310 may be disposed in the display area DA on the first organic insulating layer 122. The pixel electrode 310 may be electrically connected to the source electrode 232 or the drain electrode 234. That is, the pixel electrode 310 may be disposed on or corresponding to the transistor 200, and may be electrically connected to the transistor 200. The pixel electrode 310 may include a metal, an alloy, a conductive metal oxide, a conductive metal nitride, a transparent conductive material, and/or the like.

The second organic insulating layer 124 may be disposed in the display area DA on the first organic insulating layer 122. In an embodiment, for example, the second organic insulating layer 124 may be a pixel defining layer. The second organic insulating layer 124 may partially cover the pixel electrode 310 on the first organic insulating layer 122. The second organic insulating layer 124 may have a pixel opening exposing at least a portion of the pixel electrode 310. In an embodiment, for example, the pixel opening may expose a central portion of the pixel electrode 310, and the second organic insulating layer 124 may cover a peripheral portion of the pixel electrode 310. The second organic insulating layer 124 may include an organic insulating material.

Hereinafter, the first organic insulating layer 122 and the second organic insulating layer 124 may together be referred to as an organic insulating layer 120. The first groove G1 may be spaced apart from the organic insulating layer 120 in the first direction DR1.

The emission layer 320 may be disposed on the pixel electrode 310 which is exposed by the pixel opening. That is, the emission layer 320 may be disposed in the pixel opening. The emission layer 320 may be disposed between the pixel electrode 310 and the common electrode 330. The emission layer 320 may include at least one of an organic light emitting material and a quantum dot.

In an embodiment, the organic light emitting material may include a low molecular organic compound or a high molecular organic compound. In an embodiment, for example, the low molecular organic compound may include copper phthalocyanine, N,N'-diphenylbenzidine, tris-(8-hydroxyquinoline)aluminum, and/or the like. The high molecular organic compound may include poly(3,4-ethylenedioxythiophene), polyaniline, poly-phenylenevinylene, polyfluorene, and/or the like.

The common electrode 330 may be disposed on the emission layer 320, and may overlap or correspond to the pixel electrode 310. In an embodiment, the common electrode 330 may be disposed in an entirety of the display area DA and an entirety of the non-display area NDA on the second organic insulating layer 124. In an embodiment, for example, the common electrode 330 may cover the side surface G1a and the bottom surface G1b at the first groove G1. In an embodiment, the common electrode 330 may be disposed only in the display area DA on the second organic insulating layer 124. The common electrode 330 may include a metal, an alloy, a conductive metal oxide, a conductive metal nitride, a transparent conductive material, and/or the like.

The pixel electrode 310, the emission layer 320, and the common electrode 330 may together form the light emitting element 300. The light emitting element 300 may be disposed on the first organic insulating layer 122.

In an embodiment, a spacer 130 may be disposed in the display area DA on the second organic insulating layer 124. The spacer 130 may maintain a gap between a mask (not illustrated) and the substrate 100 in a process of providing or forming the emission layer 320. Accordingly, the spacer 130 may prevent or reduce the emission layer 320 from being damaged or scratched by the mask.

The spacer 130 and the second organic insulating layer 124 may include substantially the same or similar material. In an embodiment, for example, when providing or forming the second organic insulating layer 124 and the spacer 130 using a halftone mask, the second organic insulating layer 124 and the spacer 130 may be substantially simultaneously (or concurrently) provided or formed to have different heights. The second organic insulating layer 124 and the spacer 130 may be substantially simultaneously (or concurrently) provided or formed from a same material layer so as to be considered in a same layer as each other.

The first dam 510 and the second dam 520 may be disposed in the non-display area NDA on the substrate 100. When providing or forming the organic encapsulation layer 420 using an organic material such as a monomer, the first dam 510 and the second dam 520 may prevent or reduce the organic material from overflowing in an edge direction (e.g., the first direction DR1 in FIG. 2) of the substrate 100.

In an embodiment, for example, the first dam 510 may be disposed in the first dam area DMA1 on the interlayer insulating layer 113. That is, the first dam 510 may be spaced apart from the organic insulating layer 120 in the first direction DR1 along the substrate 100.

In an embodiment, for example, the second dam 520 may be disposed in the second dam area DMA2 on the interlayer insulating layer 113. That is, the second dam 520 may be positioned outside the first dam 510, and may be spaced apart from the first dam 510 in the first direction DR1 along the substrate 100.

In an embodiment, each of the first dam 510 and the second dam 520 may have a multi-layered structure including a plurality of layers. In an embodiment, for example, the first dam 510 may include a first layer 511, a second layer 512, and a third layer 513. The second dam 520 may include a first layer 521, a second layer 522, and a third layer 523. In an embodiment, for example, the first layers 511 and 521 may be substantially simultaneously (or concurrently) provided or formed with the first organic insulating layer 122. The second layers 512 and 522 may be substantially simultaneously (or concurrently) provided or formed with the second organic insulating layer 124. The third layers 513 and 523 may be substantially simultaneously (or concurrently) provided or formed with the spacer 130. However, embodiments are not limited thereto. Where layers are substantially simultaneously (or concurrently) provided or formed, the layers are respective patterns of a same material layer, such as to be in a same layer as each other among layers on the substrate 100, without being limited thereto.

In an embodiment, a first opening OP1 may be provided or formed between the organic insulating layer 120 and the first dam 510. That is, the first opening OP1 may be defined as a space by which the first dam 510 is spaced apart from the organic insulating layer 120. The first opening OP1 may overlap or correspond to the first area 1A.

The first groove G1 may be positioned in the non-display area NDA between the organic insulating layer 120 and the first dam 510. That is, the first groove G1 may overlap or correspond to the first opening OP1. The first groove G1 may be spaced apart from each of the organic insulating layer 120 and the first dam 510.

A second opening OP2 may be provided or formed between the first dam 510 and the second dam 520. That is, the second opening OP2 may be defined as a space by which the second dam 520 is spaced apart from the first dam 510. The second opening OP2 may overlap or correspond to the second area 2A.

The encapsulation layer 400 may be disposed on the common electrode 330. The encapsulation layer 400 may cover the light emitting element 300. The encapsulation layer 400 may encapsulate the display area DA to protect the light emitting element 300 from foreign substances.

The encapsulation layer 400 may include at least one inorganic encapsulation layer and at least one organic encapsulation layer. In an embodiment, for example, the encapsulation layer 400 may include the first inorganic encapsulation layer 410, the organic encapsulation layer 420, and the second inorganic encapsulation layer 430.

The first inorganic encapsulation layer 410 may be disposed on the common electrode 330. In an embodiment, for example, the first inorganic encapsulation layer 410 may have a substantially uniform thickness along the profile of the common electrode 330.

In an embodiment, the first inorganic encapsulation layer 410 and the second inorganic encapsulation layer 430 may be disposed in an entirety of the display area DA and an entirety of the non-display area NDA on the substrate 100. That is, each of the first inorganic encapsulation layer 410 and the second inorganic encapsulation layer 430 may cover the display area DA, and may extend from the display area DA to the non-display area NDA to a location outside of the first dam 510 (e.g., a location along the substrate 100 which is furthest from the display area DA).

In an embodiment, as illustrated in FIG. 2, the first inorganic encapsulation layer 410 may cover the side surface G1a and the bottom surface G1b at the first groove G1. In an embodiment, for example, after the first groove G1 is provided or formed on the substrate 100, the first inorganic encapsulation layer 410 may be provided or formed on an entirety of the substrate 100.

The organic encapsulation layer 420 may be disposed on the first inorganic encapsulation layer 410, and may cover the display area DA. The organic encapsulation layer 420 may have a substantially flat upper surface without a step around the first inorganic encapsulation layer 410.

In an embodiment of a method of providing the display device 10, the organic encapsulation layer 420 may be provided or formed by an inkjet process using an organic material such as a transparent monomer. In this case, when the amount of the organic material is relatively large or a position where the organic material is ejected leans toward the outside of the substrate 100 (e.g., in the first direction DR1 of the substrate 100), the organic material may overflow to the outside of the first dam 510 and/or the second dam 520. In contrast, when the amount of the organic material is relatively small or the position where the organic material is ejected leans toward a direction opposite to the first direction DR1, the organic encapsulation layer 420 may not cover a portion of the display area DA and/or cracks may occur in the first and second inorganic encapsulation layers 410 and 430. Therefore, accuracy of ejection of the organic material relative to a target position on the substrate is determined in providing the display device 10.

In an embodiment, the organic encapsulation layer 420 may be positioned inside the first dam 510, that is, between the first dam 510 and the display area DA. As illustrated in FIG. 2, for example, an outer edge 421a (e.g., terminal edge) of the organic encapsulation layer 420 which is furthest from the display area DA may be positioned on or corresponding to the first dam 510. In an embodiment, an outer edge 421b of the organic encapsulation layer 420 which is furthest from the display area DA may be positioned in the first-second area 1-2A. In an embodiment, an outer edge 421c of the organic encapsulation layer 420 which is furthest from the display area DA may be positioned in the groove area GA. In an embodiment, an outer edge 421d of the organic encapsulation layer 420 which is furthest from the display area DA may be positioned in the first-first area 1-1A.

In an embodiment, an edge of the organic encapsulation layer 420 which is furthest from the display area DA may be positioned outside the first dam 510 and inside the second dam 520. That is, although not illustrated in the drawing, the edge of the organic encapsulation layer 420 may be positioned in the second area 2A.

According to a conventional display device, a position of an edge of a conventional organic encapsulation layer may be determined based on a sharpness (or visibility) of an edge of a dam. In an embodiment, for example, when the edge of the conventional organic encapsulation layer is positioned inside the dam, the edge of the dam may have relatively high sharpness. In contrast, when the edge of the conventional organic encapsulation layer is positioned outside the dam (e.g., when the conventional organic encapsulation layer covers the dam), the edge of the dam may have relatively low sharpness. However, when the edge of the conventional organic encapsulation layer is positioned between a conventional display area and the dam (e.g., outer edges 421b, 421c, 421d in FIG. 2), it is difficult to accurately determine the position of the edge of the conventional organic encapsulation layer.

In embodiments, the first groove G1 may be provided or formed in the substrate 100 and open toward the encapsulation layer 400, between the organic insulating layer 120 and the first dam 510 in a direction along the substrate 100.

In addition, after the organic encapsulation layer 420 is provided or formed, a position of the edge of the organic encapsulation layer 420 may be determined based on a sharpness (or visibility) of an edge of the first groove G1. In an embodiment, for example, when the outer edge 421d of the organic encapsulation layer 420 is positioned in the first-first area 1-1A, the edge of the first groove G1 may have relatively high sharpness. When the outer edge 421b of the organic encapsulation layer 420 is positioned in the first-second area 1-2A, the edge of the first groove G1 may have relatively low sharpness. When the outer edge 421c of the organic encapsulation layer 420 is positioned in the groove area GA, a portion of the edge of the first groove G1 which is closer to the display area DA may have relatively low sharpness, and another portion of the edge of the first groove G1 which is further from the display area DA may have relatively high sharpness. That is, the position of the edge of the organic encapsulation layer 420 may be more accurately determined by using edges of the first groove G1. Accordingly, one or more embodiment of the display device 10 may be used to precisely determine and control whether the organic material of the organic encapsulation layer 420 is accurately ejected and dropped onto the target position along the substrate 100. Accordingly, a reliability of the display device 10 may be improved.

In addition, the organic material of the organic encapsulation layer 420 may be accommodated in an inner space of the first groove G1. Accordingly, the first groove G1 may prevent or reduce the organic material from overflowing by controlling a flow of the organic material along the substrate 100. In addition, even if the first dam 510 and/or the second dam 520 is omitted to reduce a dead space of the display device 10, the flow of the organic material of the organic encapsulation layer 420 may be controlled by the first groove G1, and the position of the edge of the organic encapsulation layer 420 may be determined by visibility of one or more edges of the first groove G1. Accordingly, the dead space of the display device 10 may be reduced.

FIGS. 3A to 3D are enlarged plan views of embodiment of area A of FIG. 1. FIGS. 3A to 3D are enlarged plan views illustrating various embodiments of a planar shape of the first groove G1.

Figure 3A:
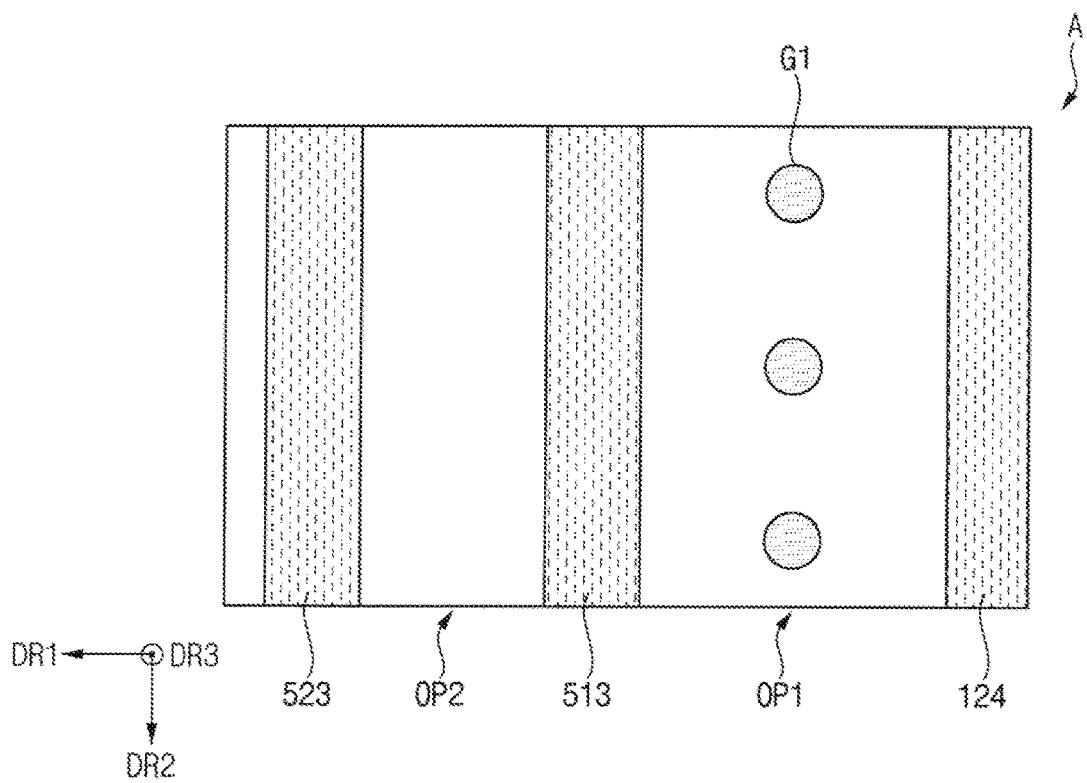
FIGS. 3A to 3D are enlarged plan views of area A of FIG. 1.

Referring to FIGS. 1, 2, and 3A, in an embodiment, the first groove G1 may include a plurality of groove patterns spaced apart from each other in a plan view. In an embodiment, for example, the first opening OP1 positioned at an edge of the display device 10 in the first direction DR1 may extend along the second direction DR2. The groove patterns may be arranged along the second direction DR2. That is, the groove patterns may have a plurality of island shapes or discrete shapes separated from each other in a plan view. In an embodiment, for example, the groove patterns may be spaced apart at a predetermined interval along the second direction DR2. In the example of FIG. 3A, each of the groove patterns may have a circular planar shape, but embodiments are not limited thereto. In embodiments, each of the groove patterns may have various discrete planar shapes such as a triangle, a square, a rhombus, a polygon, an ellipse, or the like.

Figure 3B:
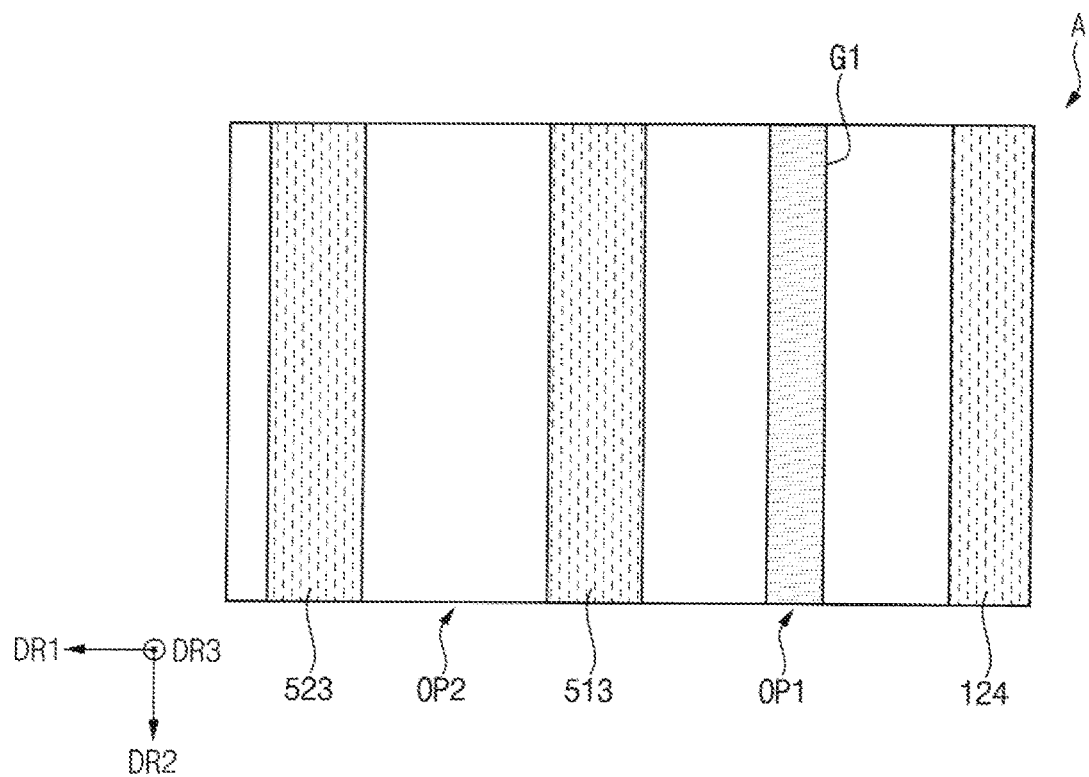

Referring to FIGS. 1, 2, and 3B, in an embodiment, at least a portion of the first groove G1 may have a stripe shape in a plan view. In an embodiment, for example, the first groove G1 positioned at the edge of the display device 10 along the first direction DR1 may have a stripe shape extending along the second direction DR2. In an embodiment, for example, the first groove G1 may have a shape that surrounds an entirety of the display area DA in a plan view.

Figure 3C:
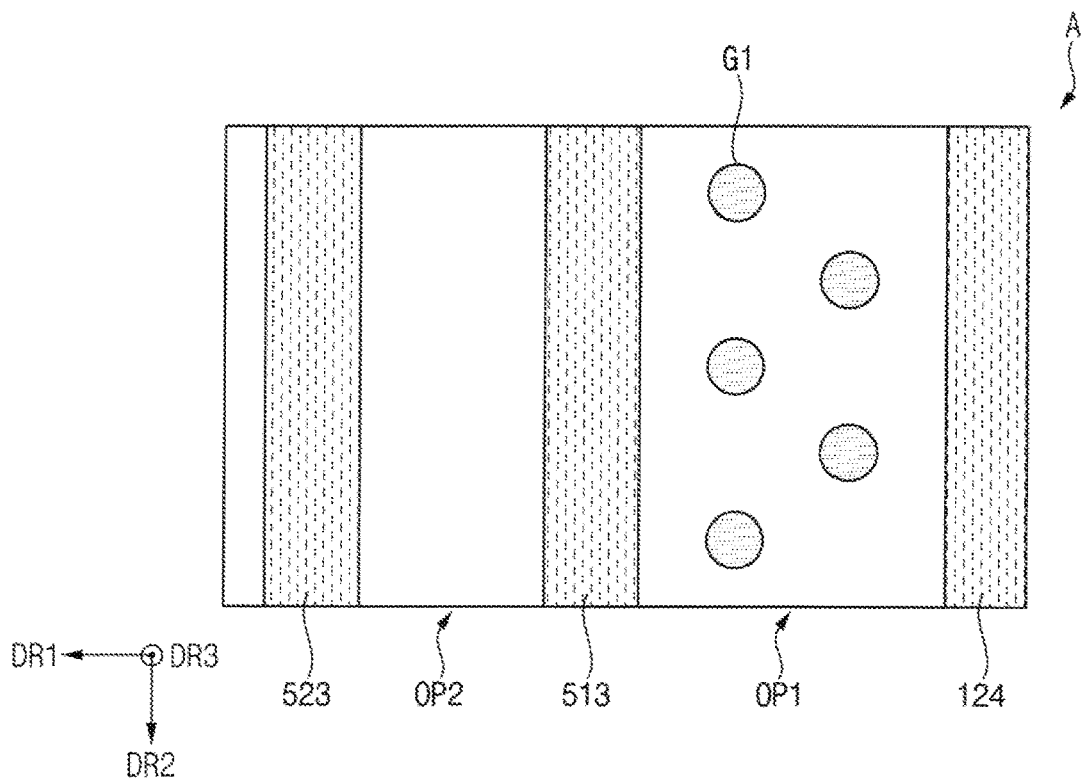

Referring to FIGS. 1, 2, and 3C, in an embodiment, the first groove G1 may be provided in plural including groove groups spaced apart from each other along the first direction DR1 inside the first opening OP1. A groove group may include a plurality of groove patterns arranged along the second direction DR2. In an embodiment, for example, when a dimension (e.g., length) of the first opening OP1 along the first direction DR1 is relatively large, two or more groove groups may be arranged along the first direction DR1 inside the first opening OP1.

Figure 3D:
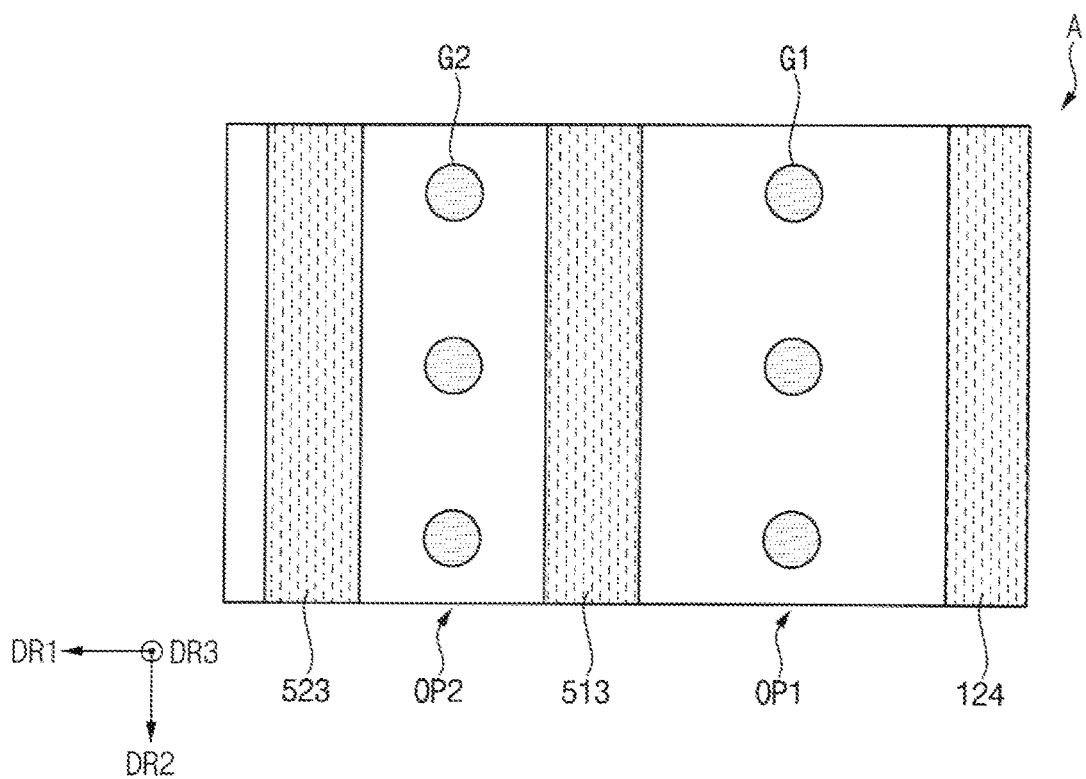

Referring to FIGS. 1, 2 and 3D, in an embodiment, the substrate 100 may further have or define a second groove G2 positioned between the first dam 510 and the second dam 520. The second groove G2 may be spaced apart from each of the first dam 510 and the second dam 520. The second groove G2 may overlap or correspond to the second area 2A and the second opening OP2. When the substrate 100 further defines the second groove G2, even if the edge of the organic encapsulation layer 420 is positioned in the second area 2A outside the first dam 510, the position of the edge of the organic encapsulation layer 420 may be accurately determined with reference to one or more edges of the second groove G2.

Figure 4B:
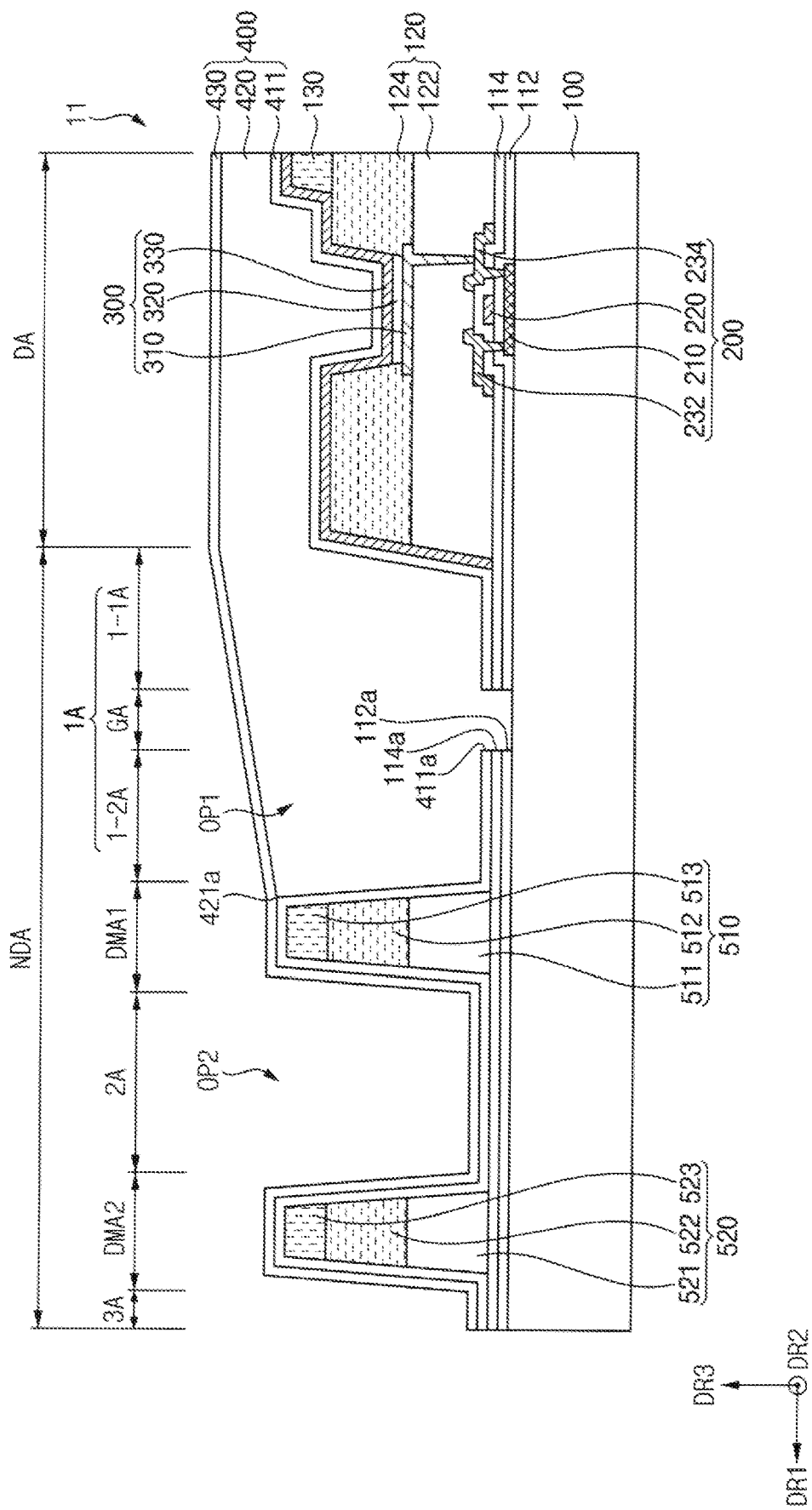

FIGS. 4A and 4B are cross-sectional views illustrating embodiments of a display device 11.

A display device 11 described with reference to FIGS. 4A and 4B may be substantially the same as or similar to the display device 10 described with reference to FIG. 2 except for a gate insulating layer 112, an interlayer insulating layer 114, and a first inorganic encapsulation layer 411. Therefore, repeated descriptions will be omitted or simplified.

Referring to FIG. 4A, in an embodiment, each of the gate insulating layer 112, the interlayer insulating layer 114, and the first inorganic encapsulation layer 411 may have a hole corresponding to and exposing the first groove G1 to outside the gate insulating layer 112, the interlayer insulating layer 114, and the first inorganic encapsulation layer 411. That is, the gate insulating layer 112, the interlayer insulating layer 114, and the first inorganic encapsulation layer 411 may be disconnected at the first groove G1 to form respective holes which are aligned with each other. In an embodiment, for example, the bottom surface G1b of the first groove G1 may be exposed to outside the gate insulating layer 112, the interlayer insulating layer 114, and the first inorganic encapsulation layer 411 by the holes.

Sidewalls of the gate insulating layer 112, the interlayer insulating layer 114, and the first inorganic encapsulation layer 411 respectively form the holes. In an embodiment, for example, side surfaces 112a, 114a, and 411a of the gate insulating layer 112, the interlayer insulating layer 114, and the first inorganic encapsulation layer 411 defines the holes and the side surface G1a of the substrate 100 at the first groove G1 may be aligned with each other. That is, the side surfaces 112a, 114a, 411a of the gate insulating layer 112, the interlayer insulating layer 114, and the first inorganic encapsulation layer 411 at the holes and the side surface G1a of the substrate 100 at the first groove G1 may define a substantially same sidewall surface (when the first groove G1 has a circular planar shape, a substantially same curved surface) to be planar with each other. In other words, the holes and the first groove G1 may share a substantially same inclined surface (e.g., etching surface).

The holes may be substantially simultaneously (or concurrently) provided or formed with the first groove G1. In an embodiment of providing the display device 11, for example, after the gate insulating layer 112, the interlayer insulating layer 114, and the first inorganic encapsulation layer 411 are provided or formed on the substrate 100, a portion of the substrate 100, a portion of the gate insulating layer 112, a portion of the interlayer insulating layer 114, and a portion of the first inorganic encapsulation layer 411 along a thickness direction of each of the layers may be removed such as by a laser drilling process, so that the holes and the first groove G1 may be substantially simultaneously (or concurrently) provided or formed.

Referring to FIG. 4B, in an embodiment, the portion of the gate insulating layer 112, the portion of the interlayer insulating layer 114, and the portion of the first inorganic encapsulation layer 411 may be removed at the groove area GA such as by the laser drilling process, and the portion of the substrate 100 may not be removed at the groove area GA by the laser drilling process. In this case, each of the gate insulating layer 112, the interlayer insulating layer 114, and the first inorganic encapsulation layer 411 may define a hole overlapping or corresponding to the groove area GA. The position of the edge of the organic encapsulation layer 420 may be determined based on a sharpness (or visibility) of an edge of the holes.

In embodiments, although not illustrated in the drawing, after the gate insulating layer 112 is provided or formed on the substrate 100, the first groove G1 may be provided or formed in the substrate 100 along with a hole in the gate insulating layer 112. Subsequently, the interlayer insulating layer 114 and the first inorganic encapsulation layer 411 may be provided or formed on the substrate 100 having the side surface G1a and the bottom surface G1b defining the first groove G1. In this case, the gate insulating layer 112 may have a hole exposing the substrate 100 to outside the gate insulating layer 112 at the first groove G1. The interlayer insulating layer 114 and the first inorganic encapsulation layer 411 may cover the side surface G1a and the bottom surface G1b of the substrate 100 at the first groove G1.

In embodiments, although not illustrated in the drawing, after the gate insulating layer 112 and the interlayer insulating layer 114 are provided or formed on the substrate 100, the first groove G1 may be provided or formed in the substrate 100 along with a hole in the gate insulating layer 112 and a hole in the interlayer insulating layer 114. Subsequently, the first inorganic encapsulation layer 411 may be provided or formed on the substrate 100 having the side surface G1a and the bottom surface G1b defining the first groove G1. In this case, each of the gate insulating layer 112 and the interlayer insulating layer 114 may have a hole exposing the substrate 100 to outside the gate insulating layer 112 and the interlayer insulating layer 114 at the first groove G1. The first inorganic encapsulation layer 411 may cover the side surface G1a and the bottom surface G1b of the first groove G1.

FIGS. 5A to 5G are cross-sectional views illustrating an embodiment of a method of providing or manufacturing a display device 10. FIGS. 5A to 5G may illustrate a method of manufacturing the display device 10 described with reference to FIG. 2. Therefore, repeated descriptions will be omitted or simplified.

Figure 5A:
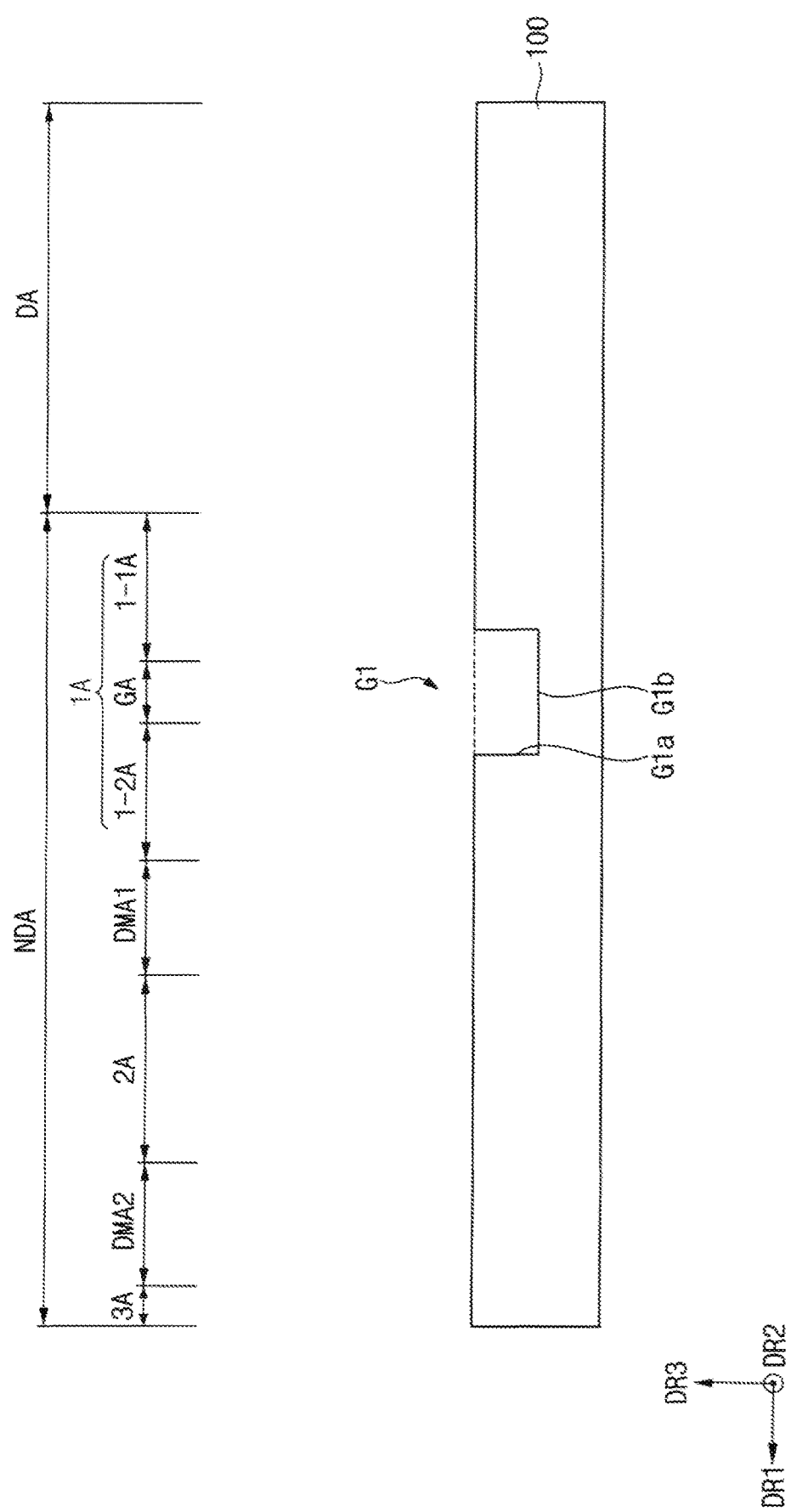

Referring to FIG. 5A, the substrate 100 having the display area DA and the non-display area NDA may be prepared. In an embodiment, for example, the substrate 100 may be a polyimide substrate. In this case, a carrier glass (not illustrated) may be disposed under the substrate 100. In an embodiment, the substrate 100 may include glass, quartz, or the like.

The first groove G1 may be formed (or provided) in the non-display area NDA in the substrate 100. Portions of the substrate 100 may define the first groove G1. The first groove G1 may be extended from one surface of the substrate 100, to be open in a direction away from the substrate 100, to overlap or correspond to the groove area GA. The first groove G1 may be spaced apart from the display area DA in a direction along the substrate 100.

The first groove G1 may be formed in the substrate 100 by various known methods. In an embodiment, for example, the first groove G1 may be formed by a laser drilling process, a wet etching or dry etching using a photolithography process, or the like.

In an embodiment, the first groove G1 may be formed such that the side surface G1a of the substrate 100 has a relatively large inclination angle with respect to the bottom surface G1b of the substrate 100 which defines the bottom of the first groove G1. In an embodiment, the first groove G1 may be formed such that the side surface G1a has a relatively small inclination angle with respect to the bottom surface G1b, and has an inclined cross-sectional shape. In an embodiment, for example, the inclination angle may be adjusted by intensity distribution of a laser beam irradiated during the laser drilling process or the like.

In an embodiment, the first groove G1 may be formed to include a plurality of groove patterns spaced apart from each other in a plan view. The groove patterns may be arranged along the second direction DR2. That is, the groove patterns may have a plurality of island shapes separated from each other in a plan view. In an embodiment, for example, the groove patterns may be spaced apart at a predetermined interval along the second direction DR2. Each of the groove patterns may have various planar shapes such as a circle, a triangle, a square, a rhombus, a polygon, an ellipse, or the like.

In an embodiment, the first groove G1 may be formed such that at least a portion of the first groove G1 has a stripe shape in a plan view. In an embodiment, for example, the first groove G1 positioned at the edge of the display device 10 in the first direction DR1 may have a stripe shape extending along the second direction DR2. In an embodiment, for example, the first groove G1 may have a shape that surrounds an entirety of the display area DA in a plan view.

Referring to FIG. 5B, the active layer 210 may be formed in the display area DA on the substrate 100. In an embodiment, for example, the active layer 210 may be formed using an amorphous silicon, a polycrystalline silicon, an oxide semiconductor, or the like.

The gate insulating layer 111 may be formed on the substrate 100 and the active layer 210. In an embodiment, for example, the gate insulating layer 111 may be formed in an entirety of the display area DA and an entirety of the non-display area NDA on the substrate 100. In an embodiment, for example, the gate insulating layer 111 may be formed using an inorganic insulating material.

A portion of the gate insulating layer 111 disposed in the display area DA may cover the active layer 210 on the substrate 100. Another portion of the gate insulating layer 111 disposed in the non-display area NDA may cover the side surface G1a and the bottom surface G1b of the substrate 100 at the first groove G1. In an embodiment, for example, the gate insulating layer 111 may have a substantially uniform thickness along the profile of the active layer 210 and the first groove G1.

Figure 5C:
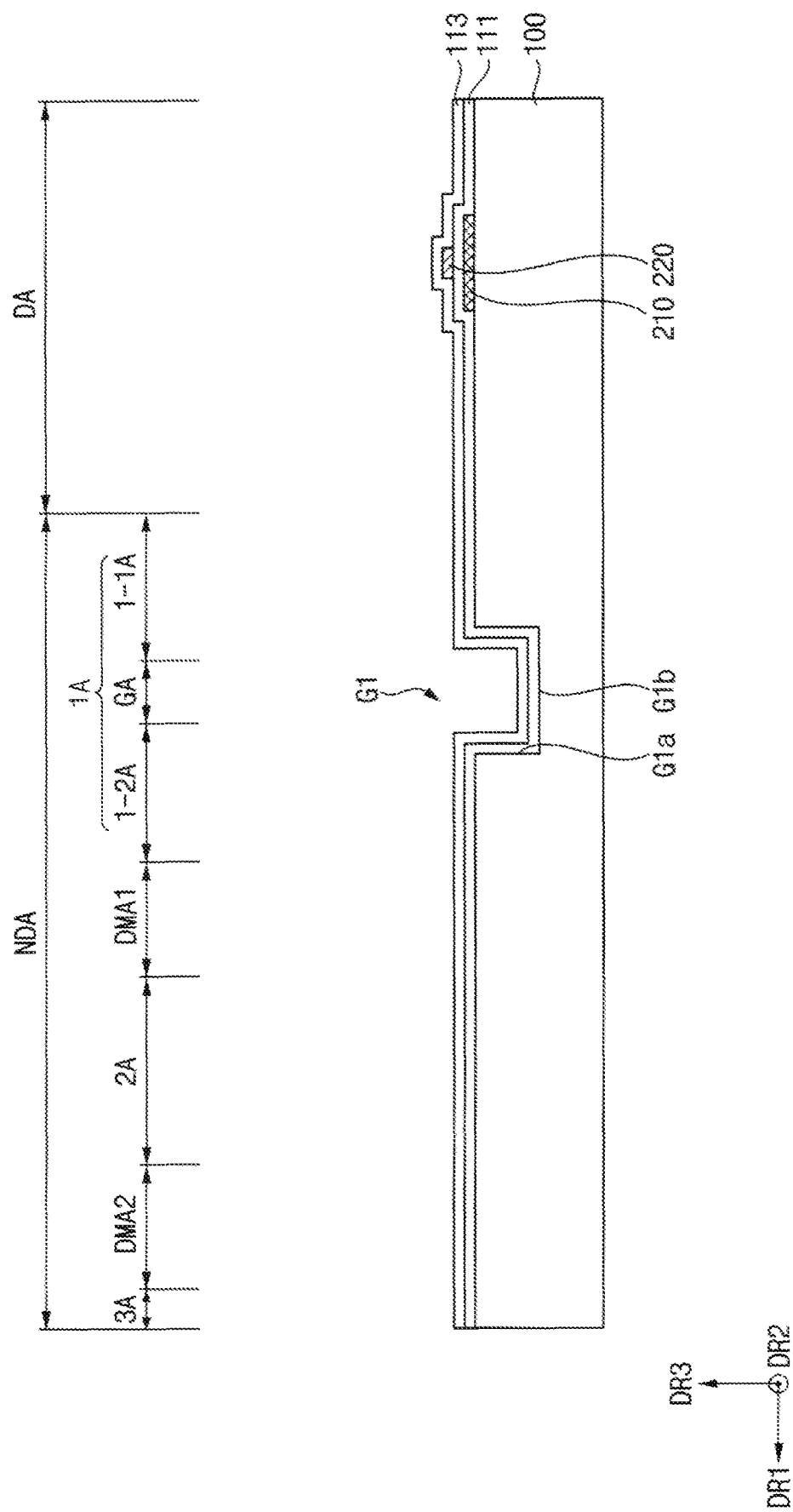

Referring to FIG. 5C, the gate electrode 220 may be formed in the display area DA on the gate insulating layer 111. The gate electrode 220 may be formed to overlap the channel area of the active layer 210. In an embodiment, for example, the gate electrode 220 may be formed using a metal, an alloy, a conductive metal oxide, a conductive metal nitride, a transparent conductive material, and/or the like.

The interlayer insulating layer 113 may be formed on the gate insulating layer 111 and the gate electrode 220. In an embodiment, for example, the interlayer insulating layer 113 may be formed in an entirety of the display area DA and an entirety of the non-display area NDA on the gate insulating layer 111. In an embodiment, for example, the interlayer insulating layer 113 may be formed using an inorganic insulating material.

A portion of the interlayer insulating layer 113 formed in the display area DA may cover the gate electrode 220 on the gate insulating layer 111. Another portion of the interlayer insulating layer 113 formed in the non-display area NDA may cover the side surface G1$a$ and the bottom surface G1$b$ of the substrate 100 at the first groove G1. In an embodiment, for example, the interlayer insulating layer 113 may have a substantially uniform thickness along the profiles of the gate insulating layer 111 and the gate electrode 220.

Referring to FIG. 5D, contact holes may be formed in the gate insulating layer 111 and the interlayer insulating layer 113 to overlap each of the source area and the drain area of the active layer 210, respectively. Subsequently, the source electrode 232 and the drain electrode 234 may be formed on the interlayer insulating layer 113 to overlap and extend into the contact holes, respectively. The source electrode 232 and the drain electrode 234 may be electrically connected to the source area and the drain area of the active layer 210 through each of the contact holes, respectively. Accordingly, the transistor 200 including the active layer 210, the gate electrode 220, the source electrode 232, and the drain electrode 234 may be formed in the display area DA on the substrate 100.

The first organic insulating layer 122 may be formed in the display area DA on the substrate 100 to cover the transistor 200. The first organic insulating layer 122 may be spaced apart from the first groove G1 in the direction opposite to the first direction DR1. The first organic insulating layer 122 may cover the interlayer insulating layer 113, the source electrode 232, and the drain electrode 234. The first organic insulating layer 122 may be formed using an organic insulating material.

A contact hole may be formed in the first organic insulating layer 122. The contact hole may expose at least a portion of an upper surface of the drain electrode 234 to outside the first organic insulating layer 122. The pixel electrode 310 may be formed in the display area DA on the first organic insulating layer 122. The pixel electrode 310 may be electrically connected to the drain electrode 234 through the contact hole. In an embodiment, for example, the pixel electrode 310 may be formed using a metal, an alloy, a conductive metal oxide, a conductive metal nitride, a transparent conductive material, and/or the like.

The second organic insulating layer 124 may be formed in the display area DA on the first organic insulating layer 122. The second organic insulating layer 124 may be spaced apart from the first groove G1 in the direction opposite to the first direction DR1. The second organic insulating layer 124 may partially cover the pixel electrode 310 on the first organic insulating layer 122. The pixel opening exposing at least a portion of the pixel electrode 310 to outside the second organic insulating layer 124 may be formed in the second organic insulating layer 124. The second organic insulating layer 124 may be formed using an organic insulating material.

In an embodiment, the spacer 130 may be formed in the display area DA on the second organic insulating layer 124.

In an embodiment, for example, the spacer 130 may be substantially simultaneously (or concurrently) formed with the second organic insulating layer 124 using a halftone mask. In this case, the spacer 130 and the second organic insulating layer 124 may include substantially the same or similar material.

The first dam 510 and the second dam 520 may be formed in the non-display area NDA on the substrate 100. The first dam 510 may be formed in the first dam area DMA1. That is, the first dam 510 may be spaced apart from each of the organic insulating layer 120 and the first groove G1 in the first direction DR1. The first opening OP1 may be defined as a space (or distance) by which the first dam 510 is spaced apart from the organic insulating layer 120.

The second dam 520 may be formed in the second dam area DMA2. That is, the second dam 520 may be spaced apart from the first dam 510 in the first direction DR1. The second opening OP2 may be defined as a space by which the second dam 520 is spaced apart from the first dam 510.

In an embodiment, each of the first dam 510 and the second dam 520 may be substantially simultaneously (or concurrently) formed with at least one of the first organic insulating layer 122, the second organic insulating layer 124, and the spacer 130.

In an embodiment, for example, the first dam 510 may include the first layer 511, the second layer 512, and the third layer 513. The second dam 520 may include the first layer 521, the second layer 522, and the third layer 523. In an embodiment, for example, the first layers 511 and 521 may be substantially simultaneously (or concurrently) formed with the first organic insulating layer 122. The second layers 512 and 522 may be substantially simultaneously (or concurrently) formed with the second organic insulating layer 124. The third layers 513 and 523 may be substantially simultaneously (or concurrently) formed with the spacer 130.

The emission layer 320 may be formed in the display area DA on the pixel electrode 310. For example, the emission layer 320 may be formed on the pixel electrode 310 exposed by the pixel opening of the second organic insulating layer 124 to outside thereof. The emission layer 320 may be formed using at least one of an organic light emitting material and a quantum dot.

The common electrode 330 may be formed in the display area DA on the emission layer 320. In an embodiment, the common electrode 330 may be formed in an entirety of the display area DA and the non-display area NDA on the second organic insulating layer 124. In an embodiment, for example, the common electrode 330 may cover the side surface G1$a$ and the bottom surface G1$b$ of the substrate 100 at the first groove G1. In an embodiment, the common electrode 330 may be formed only in the display area DA on the second organic insulating layer 124.

In an embodiment, for example, the common electrode 330 may be formed of a metal, an alloy, a conductive metal oxide, a conductive metal nitride, a transparent conductive material, and/or the like. Accordingly, the light emitting element 300 including the pixel electrode 310, the emission layer 320, and the common electrode 330 may be formed in the display area DA on the substrate 100 and the organic insulating layer 120.

Sidewalls of the common electrode 330 and the first dam 510 may define the first opening OP1. Sidewalls of the first dam 510 and the second dam 520 may define the second opening OP2.

Figure 5E:
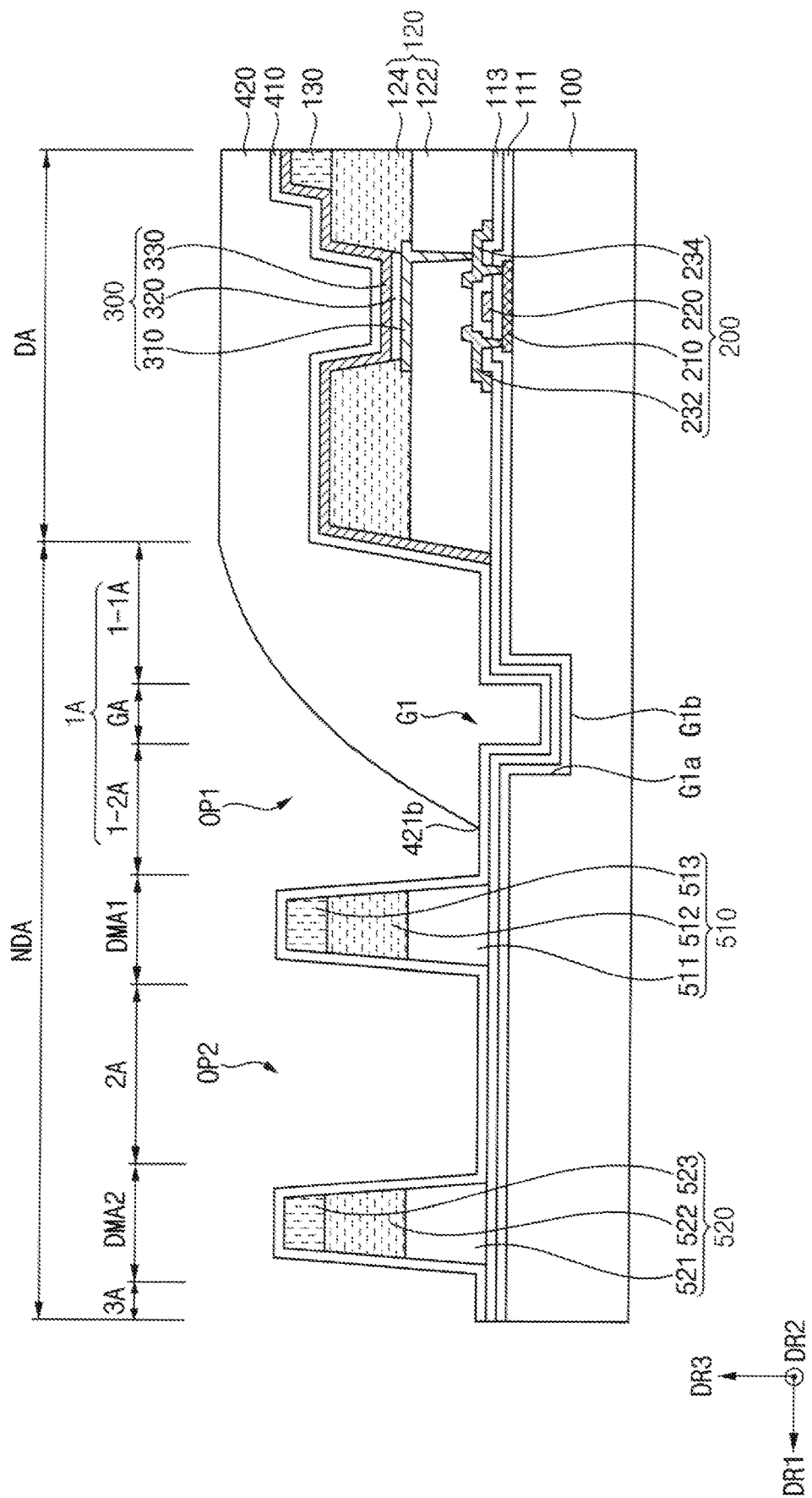

Referring to FIG. 5E, the first inorganic encapsulation layer 410 may be formed on the interlayer insulating layer 113 and the common electrode 330. The first inorganic encapsulation layer 410 may cover the light emitting element 300 on the organic insulating layer 120. In an embodiment, for example, the first inorganic encapsulation layer 410 may be formed in an entirety of the display area DA and an entirety of the non-display area NDA on the substrate 100 and the organic insulating layer 120. The first inorganic encapsulation layer 410 may be formed using an inorganic insulating material.

A portion of the first inorganic encapsulation layer 410 formed in the display area DA may cover the common electrode 330. Another portion of the first inorganic encapsulation layer 410 which is extended from the display area DA to be formed in the non-display area NDA may cover the first groove G1, the first dam 510, and the second dam 520. In an embodiment, for example, the another portion of the first inorganic encapsulation layer 410 may cover the side surface G1a and the bottom surface G1b of the substrate 100 at the first groove G1. In an embodiment, for example, the first inorganic encapsulation layer 410 may have a substantially uniform thickness along the profiles of the common electrode 330, the interlayer insulating layer 113, the first dam 510, and the second dam 520.

The organic encapsulation layer 420 may be formed on the first inorganic encapsulation layer 410 to cover the display area DA. In an embodiment, for example, the organic encapsulation layer 420 may be formed using an organic material such as a transparent monomer.

In an embodiment, the organic encapsulation layer 420 may be formed by an inkjet process that ejects an ink or a solution containing the organic material onto the substrate 100 having the first inorganic encapsulation layer 410 and the structure defining the first opening OP1 and the second opening OP2. In this case, a portion of the organic encapsulation layer 420 covering the display area DA may extend from the display area DA and to the non-display area NDA which is positioned outside the display area DA. That is, a terminal edge of the organic encapsulation layer 420 may be positioned in the non-display area NDA. Hereinafter, as illustrated in FIG. 5E, an example in which the outer edge 421b of the organic encapsulation layer 420 is positioned in the first-second area 1-2A will be described.

Figure 5F:
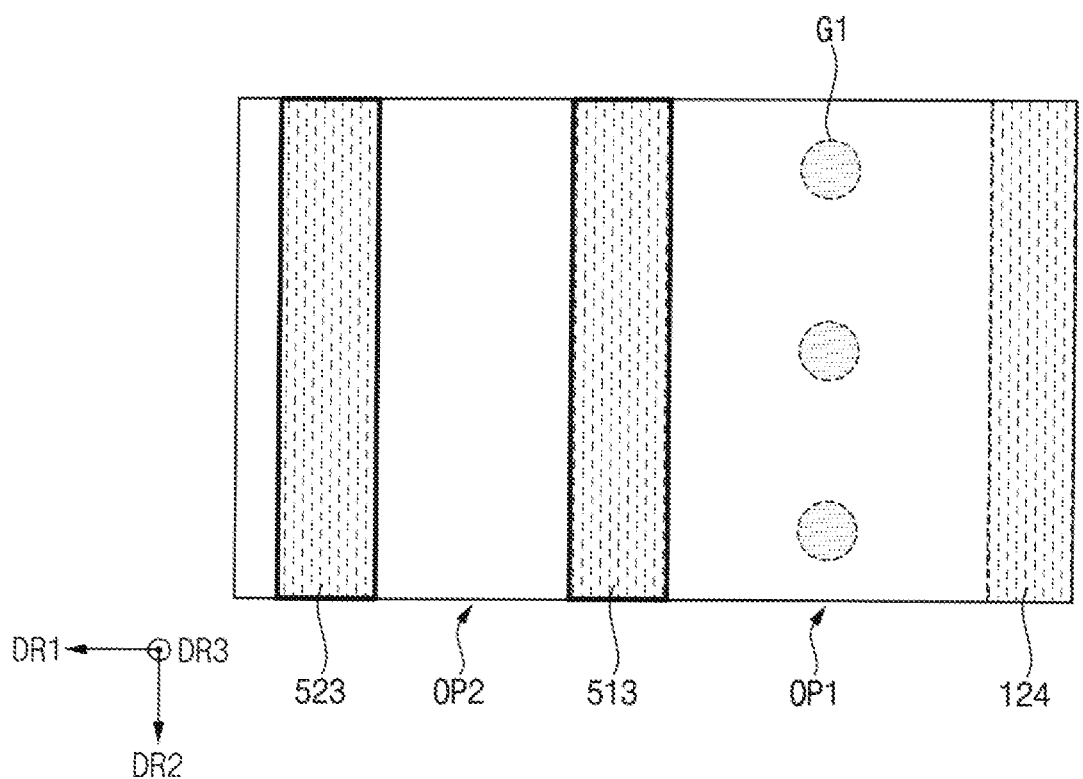

In an embodiment, the method may include providing a determination of a location of the outer edge 421b of the organic encapsulation layer 420 within the non-display area NDA by using the edge of the groove. Referring to FIG. 5F, the organic encapsulation layer 420 which is on the first inorganic encapsulation layer 410 and the structure defining the first opening OP1 and the second opening OP2 may be inspected using a structure which defines the first groove G1. That is, by determining the position of the terminal edge of the organic encapsulation layer 420 using the first groove G1, a degree to which the organic encapsulation layer 420 extends into the non-display area NDA from the display area DA may be determined.

In an embodiment, the organic encapsulation layer 420 may be inspected based on an image photographed of the non-display area NDA in which the first groove G1 is formed. The providing of the determination of the location of the outer edge 421b of the organic encapsulation layer 420 includes providing an image of the non-display area NDA which includes the edge of the groove, the providing of the image of the non-display area NDA which includes the edge of the groove includes providing a sharpness calculation of the edge of the groove within the image, and the sharpness calculation indicates the location of the outer edge 421b of the organic encapsulation layer 420 relative to the edge of the groove along the first direction DR1. In an embodiment, for example, the sharpness (or visibility) of the edge of the first groove G1 may be calculated (or detected) from the image of the organic encapsulation layer 420 in the non-display area NDA. The position of the terminal edge of the organic encapsulation layer 420 may be determined based on the calculated sharpness. In an embodiment, for example, as illustrated in FIG. 5F, the edge of the first groove G1 may have relatively low sharpness as indicated by the dotted line, since the organic encapsulation layer 420 extends over the first groove G1 (refer to FIG. 5E). In addition, edges of each of the first dam 510 and the second dam 520 may have relatively high sharpness as indicated by thicker solid lines, since the terminal edge of the organic encapsulation layer 420 is past the first groove G1 in the first direction DR1 (refer to FIG. 5E). In this case, it may be determined that the outer edge 421b of the organic encapsulation layer 420 is positioned between the first groove G1 and the first dam 510.

Figure 5G:
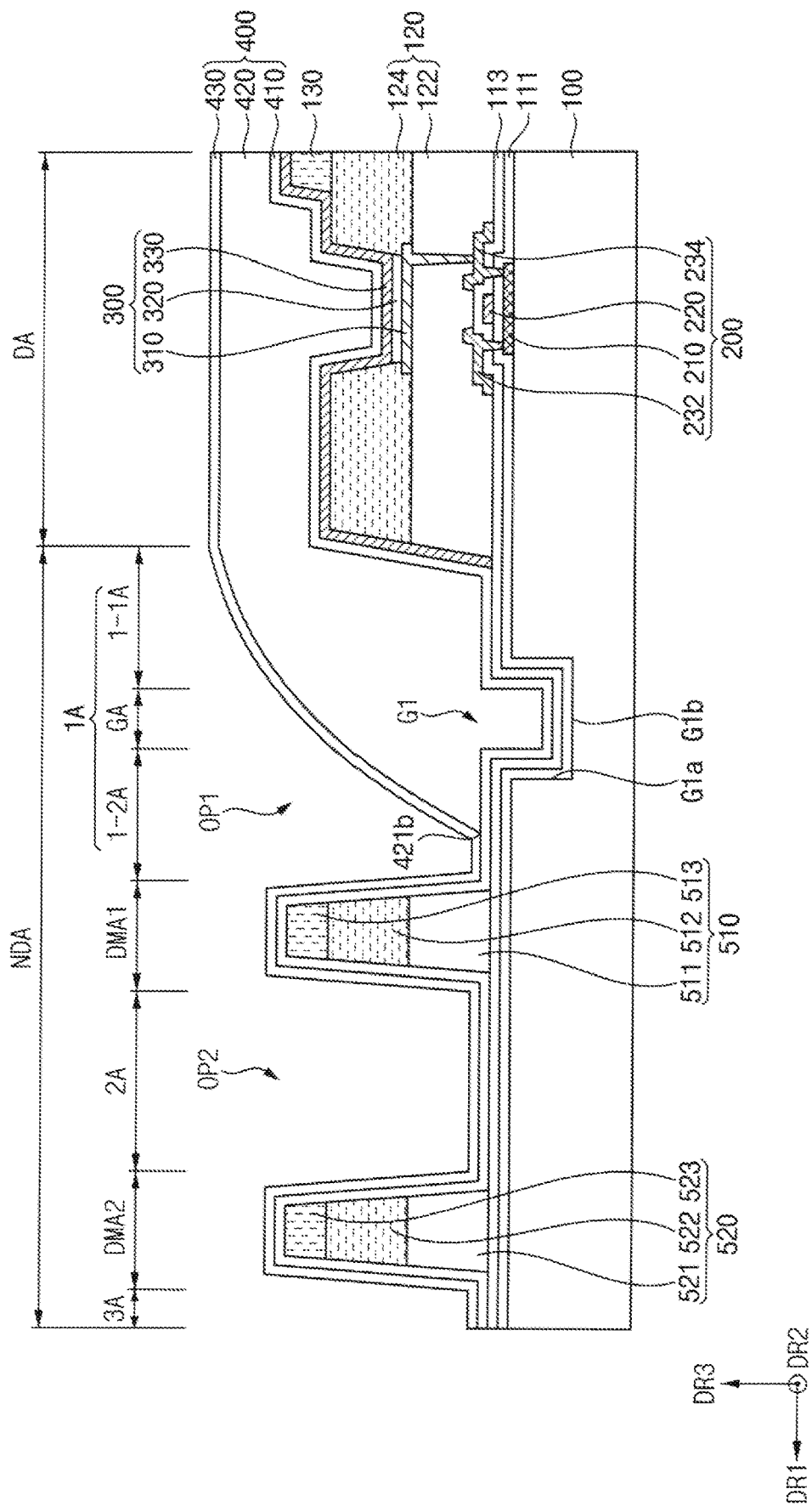

Referring to FIG. 5G, the second inorganic encapsulation layer 430 may be formed on the organic encapsulation layer 420. In an embodiment, for example, the second inorganic encapsulation layer 430 may be formed in an entirety of the display area DA and an entirety of the non-display area NDA on the substrate 100. The second inorganic encapsulation layer 430 may be formed using an inorganic insulating material.

According to one or more embodiments of the method of manufacturing the display device 10, the position of the terminal edge of the organic encapsulation layer 420 may be more accurately determined by using one or more edges of the first groove G1 formed between the organic insulating layer 120 and the first dam 510. That is, in one or more embodiment of the method of providing the display device 10, a final structure of the organic encapsulation layer 420 may be accurately inspected. Accordingly, the reliability of the display device 10 may be improved.

FIGS. 6A to 6E are cross-sectional views illustrating an embodiment of a method of providing manufacturing a display device 11. FIGS. 6A to 6E may illustrate a method of manufacturing the display device 11 described with reference to FIG. 4A.

The method of manufacturing the display device 11 described with reference to FIGS. 6A to 6E may be substantially the same as or similar to the method of manufacturing the display device 10 described with reference to FIGS. 5A to 5G except that the forming of the first groove G1 is performed between the forming of the first inorganic encapsulation layer 411 and the forming of the organic encapsulation layer 420. Therefore, repeated descriptions will be omitted or simplified.

Figure 6A:
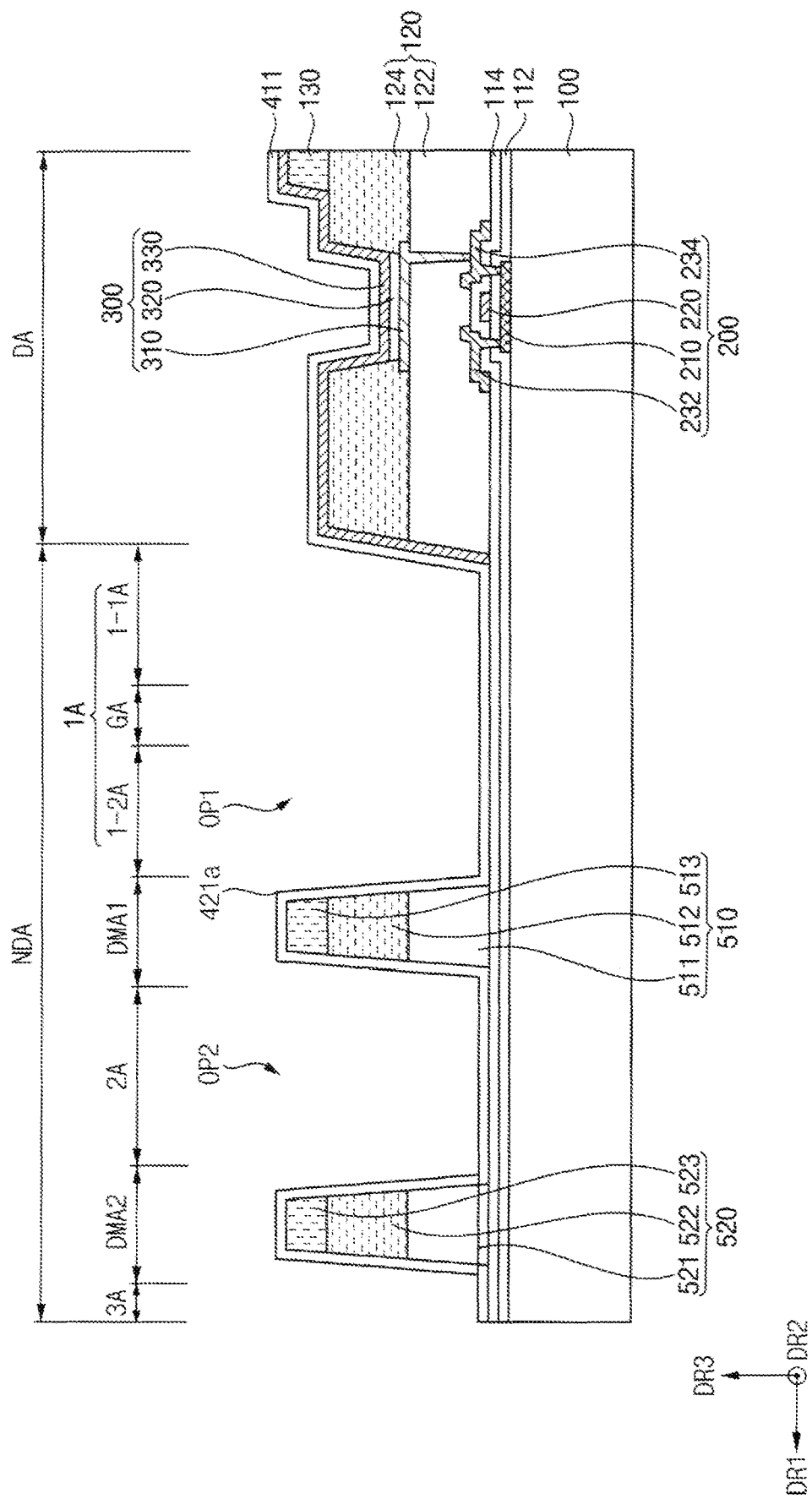
FIGS. 6A to 6E are cross-sectional views illustrating an embodiment of a method of providing a display device.

Referring to FIG. 6A, the substrate 100 having the display area DA and the non-display area NDA may be prepared. The active layer 210 may be formed (or provided) in the display area DA on the substrate 100. The gate insulating layer 112 may be formed on the substrate 100 and the active layer 210. The gate electrode 220 may be formed in the display area DA on the gate insulating layer 112. The interlayer insulating layer 114 may be formed on the gate insulating layer 112 and the gate electrode 220. The source electrode 232 and the drain electrode 234 may be formed in the display area DA on the interlayer insulating layer 114. The first organic insulating layer 122 may be formed in the display area DA on the interlayer insulating layer 114. The second organic insulating layer 124 and the light emitting element 300 may be formed in the display area DA on the first organic insulating layer 122. The first dam 510 and the second dam 520 may be formed in the non-display area NDA on the interlayer insulating layer 114. The first inorganic encapsulation layer 411 may be formed on the common electrode 330 and the interlayer insulating layer 114. The gate insulating layer 112, the interlayer insulating layer 114, and the first inorganic encapsulation layer 411 may be entirely formed in the display area DA and the non-display area NDA on the substrate 100.

Figure 6B:
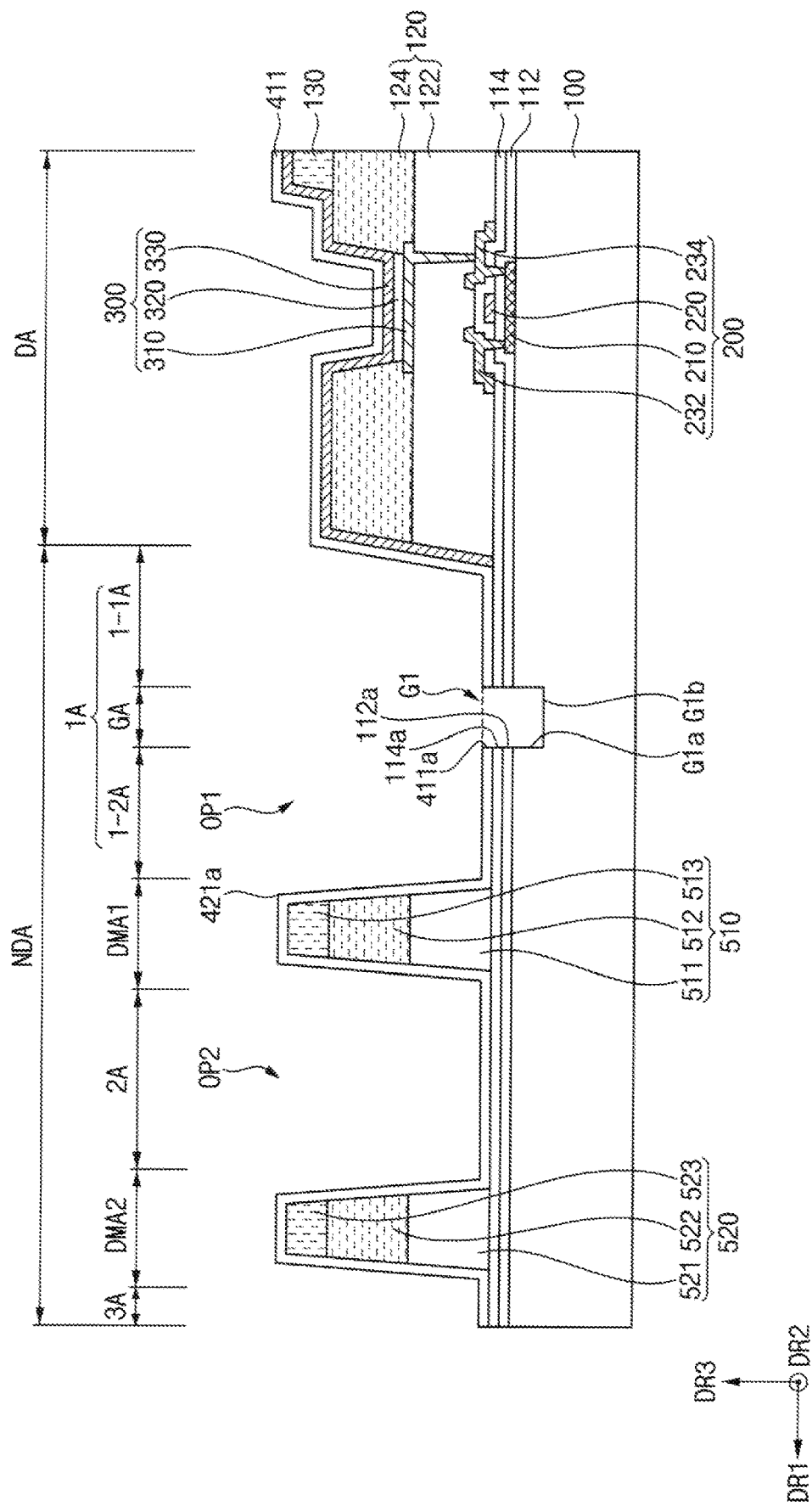

Referring to FIG. 6B, the first groove G1 may be formed in the non-display area NDA on the substrate 100. The first groove G1 may overlap or correspond to the groove area GA. The first groove G1 may be spaced apart from each of the organic insulating layer 120 and the first dam 510.

Holes may be formed in the non-display area NDA in extended into each of the gate insulating layer 112, the interlayer insulating layer 114, and the first inorganic encapsulation layer 411. The holes may expose the substrate 100 at the first groove G1 to outside of the gate insulating layer 112, the interlayer insulating layer 114, and the first inorganic encapsulation layer 411. In an embodiment, for example, the bottom surface G1b of the substrate 100 at the first groove G1 may be exposed by the holes aligned with each other at the groove area GA.

In an embodiment, the first groove G1 and the holes may be substantially simultaneously (or concurrently) formed with each other. In an embodiment, for example, a laser beam may be irradiated to the groove area GA of a stacked structure in which the gate insulating layer 112, the interlayer insulating layer 114, and the first inorganic encapsulation layer 411 are sequentially stacked on the substrate 100, so that the holes and the first groove G1 may be substantially simultaneously (or concurrently) formed.

In an embodiment, for example, the side surfaces 112a, 114a, and 411a of the gate insulating layer 112, the interlayer insulating layer 114, and the first inorganic encapsulation layer 411 which define the holes, and the side surface G1a of the substrate 100 at the first groove G1, may be aligned with each other (e.g., coplanar with each other). That is, the side surfaces 112a, 114a, 411a which define the holes and the side surface G1a which defines the first groove G1 may define a substantially same surface (when the first groove G1 has a circular planar shape, a substantially same curved surface). In other words, the holes and the first groove G1 may share a substantially same inclined surface (e.g., etching surface).

Figure 6C:
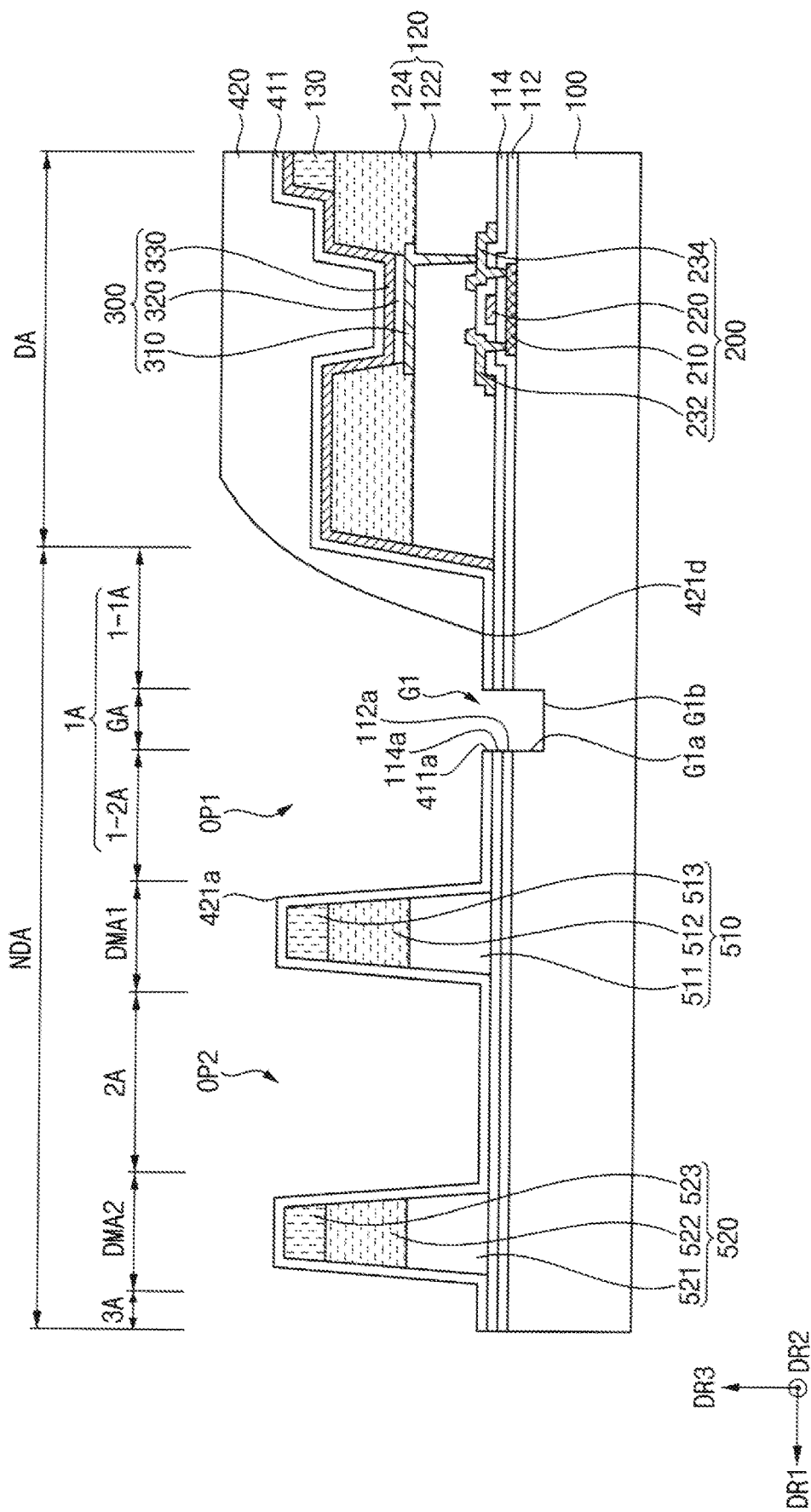

Referring to FIG. 6C, the organic encapsulation layer 420 may be formed on the first inorganic encapsulation layer 411 to cover the display area DA. In an embodiment, for example, the organic encapsulation layer 420 may be formed using an organic material such as a transparent monomer. Hereinafter, as illustrated in FIG. 6C, an example in which the outer edge 421d of the organic encapsulation layer 420 is positioned in the first-first area 1-1A will be described.

Figure 6D:
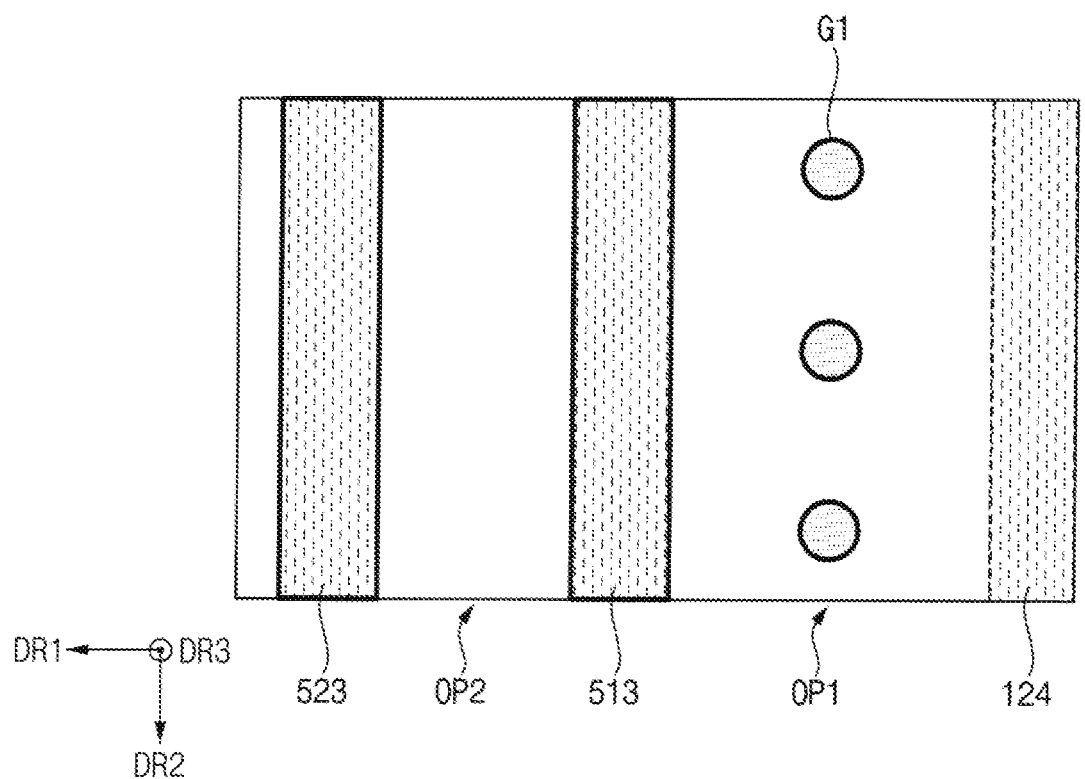

Referring to FIG. 6D, the organic encapsulation layer 420 may be inspected using the first groove G1 (or the holes). That is, by determining the position of the terminal edge of the organic encapsulation layer 420 using the first groove G1 (or the holes), a degree to which the organic encapsulation layer 420 extends to the non-display area NDA along the substrate 100 may be determined.

In an embodiment, the organic encapsulation layer 420 may be inspected based on an image photographed of the non-display area NDA in which the first groove G1 is formed (or the holes are formed). In an embodiment, for example, the sharpness (or visibility) of the edge of the first groove G1 (or the edge of the holes) may be calculated (or detected) from the image. The position of the terminal edge of the organic encapsulation layer 420 may be determined based on the calculated sharpness. In an embodiment, for example, as illustrated in FIG. 6D, the edge of the first groove G1 (or the edge of the holes) may have relatively high sharpness as indicated by thicker solid lines, since the terminal edge of the organic encapsulation layer 420 is before the first groove G1 in the first direction DR1 (refer to FIG. 6C). In addition, an edge of the organic insulating layer 120 may have relatively low sharpness as indicated by the dotted line, since the organic encapsulation layer 420 extends over the edge of the organic insulating layer 120 (refer to FIG. 6D). In this case, it may be determined that the outer edge 421d of the organic encapsulation layer 420 is positioned between the first groove G1 (or the hoes) and a terminal edge of the organic insulating layer 120.

Figure 6E:
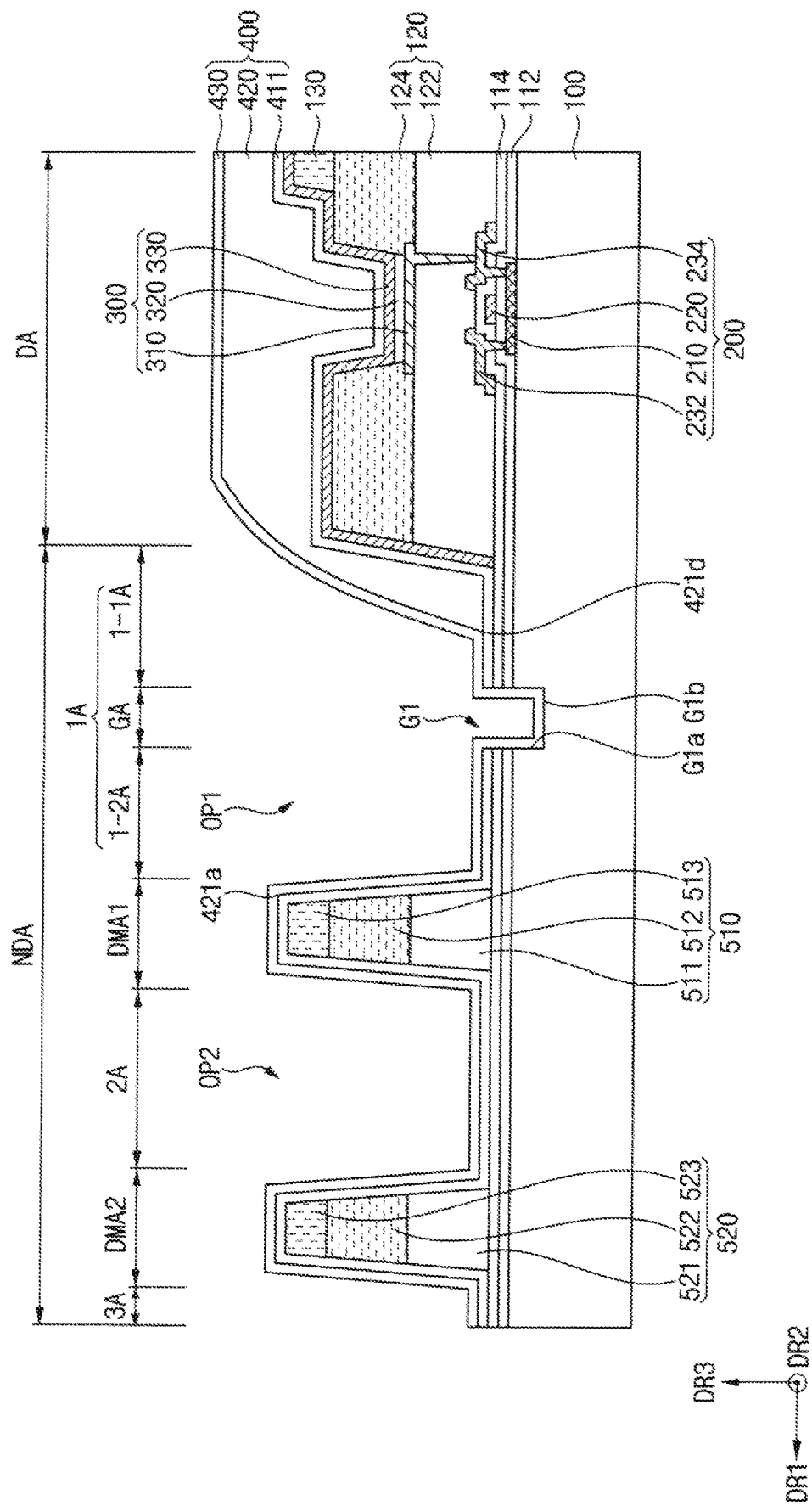

Referring to FIG. 6E, the second inorganic encapsulation layer 430 may be formed on the organic encapsulation layer 420. In an embodiment, for example, the second inorganic encapsulation layer 430 may be formed in an entirety of the display area DA and an entirety of the non-display area NDA on the substrate 100.

According to one or more embodiments of the method of manufacturing the display device 11, the position of the terminal edge of the organic encapsulation layer 420 may be more accurately determined by using one or more edges of the first groove G1 (of the holes) formed between the organic insulating layer 120 and the first dam 510. That is, in one or more embodiment of the method of providing the display device 11, a final structure of the organic encapsulation layer 420 may be accurately inspected. Accordingly, the reliability of the display device 11 may be improved.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:
1. A display device comprising:
   a base layer comprising an inorganic insulating layer;
   a display area including:
      an organic insulating layer on the base layer, and
      a light emitting element on the organic insulating layer;
   a non-display area entirely surrounding the display area, the non-display area including:
      dams including a first dam which is on the base layer, spaced apart from the organic insulating layer in a first direction and closest to the organic insulating layer among all the dams, and
      a first groove which is defined in the base layer and between the organic insulating layer and the first dam in the first direction, the first groove disposed entirely along the non-display area.

2. The display device of claim 1, wherein along the first direction, the first groove is spaced apart from each of the organic insulating layer and the first dam.

3. The display device of claim 1, wherein within the non-display area:
   the first dam which is spaced apart from the organic insulating layer in the first direction defines a first opening therebetween, and
   the first groove is open to the first opening which is between the organic insulating layer and the first dam.

4. The display device of claim 3, wherein within the non-display area the first opening which is between the organic insulating layer and the first dam extends in a second direction crossing the first direction.

5. The display device of claim 4, wherein within the first opening of the non-display area, the first groove includes a plurality of groove patterns spaced apart from each other.

6. The display device of claim 5, wherein the groove patterns are arranged along the second direction.

7. The display device of claim 4, wherein within the non-display area the first groove has a stripe shape.

8. The display device of claim 7, wherein the stripe shape of the first groove extends along the second direction.

9. The display device of claim 1, wherein in the non-display area, the dams further include a second dam spaced apart from the first dam in the first direction.

10. The display device of claim 9, wherein the non-display area further includes a second groove between the first dam and the second dam in the first direction.

11. The display device of claim 10, wherein along the first direction, the second groove is spaced apart from each of the first dam and the second dam.

12. The display device of claim 10, wherein
the second dam which is spaced apart from the first dam defines a second opening therebetween, and
the second groove corresponds to the second opening which is between the first dam and the second dam.

13. The display device of claim 1, wherein
the base layer further comprises a substrate and the inorganic insulating layer which are in the display area and in the non-display area, and
the substrate, the inorganic insulating layer, the organic insulating layer and the light emitting element are in order in the display area.

14. The display device of claim 13, wherein
the substrate includes a side surface and a bottom surface in the non-display area corresponding to a shape of the first groove, and
the inorganic insulating layer extends from the display area to cover the side surface and the bottom surface of the substrate at the first groove and to define the first groove.

15. The display device of claim 13, wherein
the substrate includes a side surface and a bottom surface in the non-display area,
the inorganic insulating layer includes a side surface in the non-display area which defines a hole in the inorganic insulating layer,
the hole in the inorganic insulating layer exposes the substrate to outside the inorganic insulating layer, and
the side surface of the substrate, the bottom surface of the substrate and the side surface of the inorganic insulating layer together define the first groove.

16. The display device of claim 13, wherein
the inorganic insulating layer includes a side surface in the non-display area which defines the first groove in the non-display area, and
the first groove defined by the inorganic insulating layer exposes the substrate to outside the inorganic insulating layer at the first groove.

17. The display device of claim 1, further comprising:
the base layer, a first inorganic encapsulation layer, an organic encapsulation layer and a second inorganic encapsulation layer in both the display area and the non-display area, and
the base layer, the light emitting element, the first inorganic encapsulation layer, the organic encapsulation layer and the second inorganic encapsulation layer in order in the display area,
wherein
the organic encapsulation layer includes an outer edge which is furthest from the display area in the first direction, and
the outer edge of the organic encapsulation layer is between the display area and the first dam.

18. The display device of claim 17, wherein in the non-display area each of the first inorganic encapsulation layer and the second inorganic encapsulation layer extends further than the first dam in the first direction.

19. The display device of claim 18, wherein
the base layer includes a side surface and a bottom surface in the non-display area which define the first groove in the non-display area, and
the first inorganic encapsulation layer extends from the display area to cover the side surface and the bottom surface of the base layer at the first groove.

20. The display device of claim 18, wherein
the base layer includes a side surface and a bottom surface in the non-display area,
the first inorganic encapsulation layer includes a side surface in the non-display area which is aligned with the side surface of the base layer, and
the side surface of the base layer, the bottom surface of the base layer and the side surface of the first inorganic encapsulation layer together define the first groove.

21. The display device of claim 18, wherein
the base layer further comprises:
a substrate and the inorganic insulating layer which is on the substrate, and
in the non-display area, a side surface defined by the inorganic insulating layer and a bottom surface defined by the substrate,
the first inorganic encapsulation layer includes a side surface in the non-display area,
the side surface of the first inorganic encapsulation layer, the side surface of the the inorganic insulating layer and the bottom surface of the substrate together define the first groove, and
the substrate is exposed to outside the first inorganic encapsulation layer at the first groove.

* * * * *